United States Patent [19]

Komatsu et al.

[11] Patent Number: 4,905,072
[45] Date of Patent: * Feb. 27, 1990

[54] SEMICONDUCTOR ELEMENT

[75] Inventors: Toshiyuki Komatsu, Yokohama; Yutaka Hirai, Tokyo; Katsumi Nakagawa, Tokyo; Yoshiyuki Osada, Yokosuka; Satoshi Omata, Tokyo; Takashi Nakagiri, Tokyo, all of Japan

[73] Assignee: Canon Kabushiki Kaisha, Tokyo, Japan

[ * ] Notice: The portion of the term of this patent subsequent to Jan. 12, 2005 has been disclaimed.

[21] Appl. No.: 188,677

[22] Filed: Apr. 29, 1988

Related U.S. Application Data

[63] Continuation of Ser. No. 56,328, May 28, 1987, abandoned, which is a continuation of Ser. No. 716,508, Mar. 25, 1985, abandoned, which is a continuation of Ser. No. 438,910, Nov. 3, 1982, abandoned.

[30] Foreign Application Priority Data

Nov. 13, 1981 [JP] Japan .............................. 56-182652
Nov. 13, 1981 [JP] Japan .............................. 56-182653
Nov. 13, 1981 [JP] Japan .............................. 56-182654

[51] Int. Cl.$^4$ ................... H01L 23/54; H01L 29/04; H01L 29/12
[52] U.S. Cl. ............................................. 357/59; 357/2
[58] Field of Search .................... 357/59, 2, 23, 58, 60

[56] References Cited

U.S. PATENT DOCUMENTS

| | | |
|---|---|---|
| 3,519,901 | 7/1970 | Bean et al. ............................. 357/59 |
| 4,176,365 | 11/1979 | Kroger ................................... 357/59 |
| 4,409,605 | 10/1983 | Ovinshinsky et al. .................. 357/2 |
| 4,701,394 | 10/1987 | Inoue et al. ............................ 357/2 |
| 4,719,501 | 1/1988 | Nagagawa et al. ..................... 357/2 |
| 4,737,429 | 4/1988 | Mort et al. ............................. 357/2 |
| 4,740,829 | 4/1988 | Nakagiri et al. ....................... 357/2 |
| 4,741,964 | 5/1988 | Haller ..................................... 357/2 |
| 4,766,477 | 8/1988 | Nakagawa et al. ..................... 357/2 |

OTHER PUBLICATIONS

"Doping of Sputtered Amorphous Semiconductors"--Brodsky et al.-IBM Technical Disclosure Bulletin, vol. 19, No. 12, May 1977, pp. 4802-4803.

"Hydrogenation of Transistors Fabricated in Polycrystalline Silicon Films"-Kamins et al.-Aug. 1980, pp. 159-161, IEEE Electron Device Letters, vol. EDL-1, No. 8.

"Diffusion of Impurities in Polycrystalline Silicon'-'-Kamins et al.-J. Appl. Phy., vol. 43, No. 1, Jan. 1972, pp. 83-91.

"Evidence for Surface Osperity Mechanism of Conductivity in Oxide Grown on Polycrystalline Silicon"-Anderson et al.-Journal of Applied Physics-vol. 13, No. 11-1977.

Primary Examiner—Rolf Hille
Assistant Examiner—S. V. Clark
Attorney, Agent, or Firm—Fitzpatrick, Cella, Harper & Scinto

[57] ABSTRACT

A semiconductor device comprises a semiconductor layer of a polycrystalline silicon thin film containing not more than 3 atomic % hydrogen atoms and having a surface unevenness of not more than 800 Å at its maximum. It may also have an etching rate of 20 Å/sec. when etched with a mixture of HF, HNO$_3$ and glacial acetic acid (1:3:6).

10 Claims, 6 Drawing Sheets

SEMICONDUCTOR ELEMENT

BACKGROUND OF THE INVENTION

This application is a continuation of application Ser. No. 056,328 filed May 28, 1987, now abandoned, which was a continuation of application Ser. No. 716,508 filed Mar. 25, 1985, now abandoned, which was a continuation of application Ser. No. 438,910 filed Nov. 3, 1082, now abandoned.

1. Field of the Invention

This invention relates to a semiconductor element such as a field effect thin film transistor, and the like, and more particularly to a semiconductor element of which the main part is constituted of a polycrystalline silicon thin film semiconductor layer which is high in desirable behavior characteristics, reliability and stability.

2. Description of the Prior Art

Recently, for consitution of a scanning circuit portion of an image reading device for use in image reading such as a one-dimensional photosensor made in a continuous length or a two-dimensional photosensorof an enlarged area, or for constitution of a driving circuit of an image display device utilizing liquid crystal (abbreviated as LC), electrochromic material (abbreviated as EC) or electroluminescence material (abbreviated as EL), it has been proposed to form a field effect thin film transistor by using as the base material a silicon thin film formed on a certain substrate, corresponding in size to the increased area of such display portions.

Such a silicon thin film is desired to be polycrystalline rather than amorphous for realization of a large scale image reading device or image display device improved in higher speed and higher function. As one of the reasons, in spite of the requirement that the effective carrier mobility ($\mu$eff) of a silicon thin film as base material for formation of a scanning circuit portion of such a high speed, high function reading device or driving circuit portion of image display device should be large, the amorphous silicon thin film obtained by the ordinary discharge decomposition method is at most 0.1 $cm^2/V$.sec. which is by far inferior to that of a single crystalline silicon. Moreover, in a semiconductor device prepared with the use of such as amorphous silicon thin film as the base material, no desired requirement can be satisfied due to marked change with lapse of time by device driving. The smallness of the mobility ($\mu$eff) and the largeness of the change with lapse of time are inherent characteristics of amorphous silicon thin film, and therefore, there is involved an inconvenience in amorphous silicon thin film that it can not take advantage of the ease of preparation of thin films and the low production cost.

In contrast, a polycrystalline silicon thin film has a mobility $\mu$eff by far greater than an amorphous silicon thin film as can be seen from the data experimentally measured. Theoretically, it is quite probable that there may be prepared a polycrystalline silicon thin film having a still higher value of mobility $\mu$eff than that presently obtained.

In the prior art, as the method for preparing a polycrystalline silicon over a large area on a given substrate, there have been well known such methods as Chemical Vapor Deposition (CVD) method, Low Pressure Chemical Vapor Deposition (LPCVD) method, Molecular Beam Epitaxy (MBE) method, Ion Plating (IP) method, Glow Discharge (GD)method, etc.

According to any one of these methods, it has been known possible to prepare a polycrystalline silicon on a substrate of a large area although the substrate temperature may differ depending on the methods.

However, under the present situation, a semiconductor element or a semiconductor device comprising its main part constituted of a semiconductor layer of a polycrystalline silicon thin film prepared by these methods cannot exhibit sufficiently desired characteristics and reliability.

SUMMARY OF THE INVENTION

The present inventors have made extensive studies in view of the above points on the basis of an idea that most semiconductor elements have structurally junctions (PN junction or MIS junction) and the characteristics and reliability as the function of element at the junction interface will determine the performance and reliability of the element, and as a consequence have successfully obtained a semiconductor element excellent in semiconductor characters, reliability, reproducibility and stability with lapse of time.

That is, in the first place, the present invention is based on a discovery that, in a semiconductor element of a polycrystalline thin film, the content of hydrogen atoms (H) in the silicon thin film and the unevenness characteristic of the silicon thin film surface determine the performance and the reliability of the element.

More particularly, the present invention is based on a discovery that in forming, for example, a field effect thin film transistor with the use of a polycrystalline silicon thin film as base material, a polycrystalline silicon thin film of the prior art had large or irregular surface unevenness of thin film and therefore such factors had effects on characteristics of the element such as lowering of effective carrier mobility ($\mu$eff), lowering of yield by gate leak, etc., changes of behaviors with lapse of time, fluctuation of respective elements, and the like. Also, the present inventors have found that inclusion of a certain amount of H in a polycrystalline silicon thin film makes the characteristics of the above element practically usable and also decreases fluctuation of respective elements to further enhance applicability thereof. It has also been found that the orientation characteristic of a polycrystalline thin film and grain size (average crystal particle size) contribute to further improvement in various characteristics as mentioned above.

Secondly, the present invention is based on a discovery that the performance and the stability of the characteristics of a semiconductor element or a semiconductor device of which the main part is constituted of a polycrystalline silicon thin film semiconductor layer are correlated with (1) the content of hydrogen atoms in the polycrystalline silicon thin film prepared and (2) an etching rate of the polycrystalline silicon film with a specific etchant. That is, it has been found that inclusion of hydrogen atoms in a semiconductor layer formed within a certain range of amount and the etching rate with a specific etchant of not higher than a certain value improve element characteristics, $\mu$eff and stability of characteristics with lapse of time, thus exhibiting practically very excellent use characteristics and overcoming substantially fluctuation in characteristics of respective elements when designed as semiconductor devices, whereby practical applicability can be dramatically enhanced.

An object of the present invention is to provide a semiconductor element having a polycrystalline silicon thin film semiconductor layer of high perfomance.

Another object of the present invention is to provide a stable field effect thin film transistor having high performance and high reliability with the use of a polycrystalline silicon thin film semiconductor formed on a support.

A further object of the present invention is to provide a semiconductor device enlarged in area comprising a constituent element of a field effect thin film transistor with the use of an excellent polycrystalline silicon thin film semiconductor layer.

According to the present invention, there is provided a semiconductor device which comprises a substrate and a semiconductor layer of a polycrystalline silicon thin film formed on the substrate and containing hydrogen atoms in an amount of not more than 3 atomic % and having a surface unevenness of substantially not more than 800 Å at its maximum, and said semiconductor layer of a polycrystalline silicon thin film constituting the main part of the semiconductor device. ("Main part" is used herein for convenience to denote a portion of a semiconductor device through which a current flows when the device is in a conducting state; see for example FIG. 1 and the accompanying description.)

According to another aspect of the present invention, there is provided a semiconductor device which comprises a semiconductor layer of a polycrystalline silicon thin film containing hydrogen atoms in an amount of not more than 3 atomic % and having an etching rate of 20 Å/sec. or less by etching with an etchant comprising a mixture of hydrofluoric acid (50 vol. % aqueous solution), nitric acid (d=1.38, 60 vol. % aqueous solution) and glacial acetic acid at a mixing ratio by volume of 1:3:6, and said semiconductor layer of a polycrystalline silicon thin film constituting the main part of the semiconductor device.

According to a further aspect of the present invention, there is provided a semiconductor device which comprises a semiconductor layer of a polycrystalline silicon thin film containing hydrogen atoms in an amount of not more than 3 atomic %, having a surface unevenness of substantially not more than 800 Å at its maximum and having an etching rate of 20 Å/sec. or less by etching with an etchant comprising a mixture of hydrofluoric acid (50 vol. % aqueous solution), nitric acid (d=1.38. 60 vol. % aqueous solution) and glacial acetic acid at a mixing ratio by volume of 1 : 3 : 6, and said semiconductor layer of a polycrystalline silicon thin film constituting the main part of the semiconductor device.

According to still another aspect of the present invention, there is provided a semiconductor device as mentioned above wherein said semiconductor layer has an X-ray diffraction pattern or an electron beam diffraction pattern, of which the orientation strength at the (220) plane is 30 % or more based on the total orientation strength, or said semiconductor layer contains crystals with an average particle size of 200 Å or larger.

DETAILED DESCRIPTION OF THE PREFERRED EMBODIMENTS

The field effect type thin film transistor (TFT) as an example of the semiconductor element prepared using the polycrystalline silicon thin film as the base material of the present invention is known as a transistor constituted of a semiconductor layer, an electrode layer and an insulating layer. That is, a voltage is applied between the source electrode and the drain electrode having ohmic contact adjacent to the semiconductor layer, and the channel current passing between said electrodes is modulated by the bias voltage applied to the gate electrode provided on the insulating layer.

Figure 1:
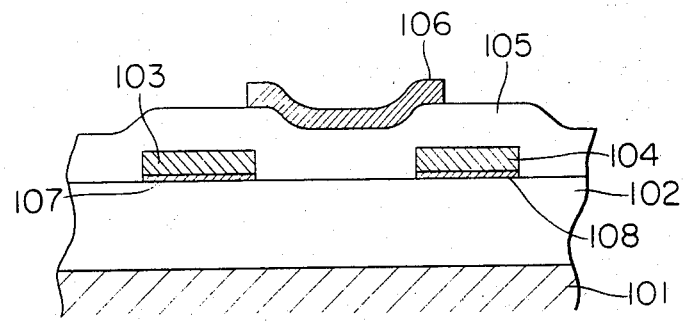
FIG. 1 shows a schematic sectional view for illustration of the semiconductor element of the present invention.

FIG. 1 shows an example of a typical basic structure of such a TFT. On a semiconductor layer 102 comprising a polycrystalline silicon provided on an insulating substrate 101, there are provided a source electrode 103 and a drain electrode 104 in contact with said semiconductor layer, and an insulating layer 105 is provided so as to cover over these electrodes, and a gate electrode 106 provided on said insulating layer 105.

In a TFT having the structure as shown in FIG. 1, the semiconductor layer 102 is constituted of a polycrystalline silicon thin film as described hereinafter, and between the semiconductor layer 102 and each of the two electrodes, namely the source electrode 103 and the drain electrode 104, there are formed, for example, a first n+ layer 107 and a second n+ layer each being constituted of amorphous silicon, thus forming an ohmic contact therebetween.

The insulating layer 105 may be constituted of a material such as silicon nitride, $SiO_2$, $Al_2O_3$, and the like which can be formed according to CVD (Chemical Vapor Deposition) method, LPCVD (Low Pressure Chemical Vapor Deposition) method or PCVD (Plasma Chemical Vapor Deposition) method.

In the present invention, various transistor characteristics can be improved by controlling the hydrogen content in the polycrystalline silicon thin film to a level of 0.01 atomic % or higher. On the other hand, the hydrogen atoms (H) contained in the polycrystallne silicon thin film mainly exist at the grain boundary and may be expected to be present in the forms of the normal form stably bound to silicon atoms in the form of Si-H, or in unstable bonded forms of $Si=H_2$, $Si=H_3$, and the like or in the form of free hydrogen atoms. It seems that in the prior art, due to such hydrogen atoms contained in an unstable state, the change of the characteristics with lapse of time occurs. In contrast, from a number of experimental facts found by the present inventors, it has been observed that by controlling the hydrogen content in the polycrystalline silicon thin film prepared to a level of 3 atomic % or less, substantially no deterioration, especially change with lapse of time, of transistor characteristics will occur, whereby the characteristics can be maintained stably. That is, in the case where the hydrogen content in the polycrystalline silicon thin film prepared exceeds 3 atomic %, when the transistor is continuously actuated as described above, changes with lapse of time have been observed, in that effective carrier mobility decreases, and the output drain current decreases with lapse of time resulting in a change in threshold voltage.

From such a point of view, in the present invention, the hydrogen content in the polycrystalline silicon thin film semiconductor layer constituting the main part of a semiconductor element is preferably 0.01 to 3 atomic more preferably 0.05 to 2 atomic %, most preferably 0.1 to 1 atomic %.

Measurement of the hydrogen content in the polycrystalline silicon film as defined in the semiconductor element of the present invention was conducted by means of a hydrogen analyzer conventionally used in chemical analysis (Elemental analyzer Model-240, produced by Perkin Elmer Co.), when the content was 0.1 atomic % or more. In any case, 5 mg of a sample was charged in the holder of the analyzer, hydrogen weight was measured and the hydrogen content in the film was calculated in terms of atomic %.

Analysis of a trace amount less than 0.1 atomic % was conducted by means of a secondary ion mass spectrometer-SIMS-(Model IMS-3f, produced by Cameca Co.). A conventional procedure was followed in this analytical method. That is, for prevention of charge-up, gold was vapor deposited to a thickness of 200 Å on a thin film of the sample, and measurement was conducted under the conditions of an ion energy of primary ion beam of 8 KeV and a sample current of $5 \times 10^{-10}$A, with a spot size of 50 μm in diameter and an etching area of 250 μm x 250 μm, to determine the detection intensity ratio of H+ ion relative to Si+ ion, from which the hydrogen content was calculated in terms of atomic %.

The field effect type TFT as an example of the semiconductor element of the present invention, can be classified into a type in which a gate insulating layer is provided on a gate electrode (lower gate type) and a type in which a gate electrode is provided on a gate insulating layer (upper gate type). On the other hand, it may also be classified into a type in which source and drain electrodes are provided at the interface between the insulating layer and the semiconductor layer (Coplanar type) and a type in which source and drain electrodes are on the semiconductor plane confronting the interface between the insulating layer and the semiconductor layer (Stagger type). Thus, there are four types of combinations in all, as is well known in the art. The structure as shown in FIG. 1 is called an upper gate coplanar type field effect TFT. In the present invention, any one of these types of field effect type TFT may be used as a matter of course.

As another specific feature of the present invention, the maximum of the surface unevenness of the polycrystalline silicon thin film constituting the main part of a semiconductor device is made 800 Å or less, whereby gate leak can markedly be decreased in case of the upper gate type field effect transistor where an insulating layer for gate is formed on the polycrystalline silicon thin film. The insulating layer for an gate is generally made as thin as possible for improvement of the transistor characteristics, but it is formed within a range of from several hundreds Å to several thousands Å. Therefore, an unevenness on the film surface exceeding at its maximum 800 Å can hardly give a range which can avoid gate leak. Further, an unevenness in excess of 800 Å will reduce markedly the characteristics of transistor, especially effective carrier mobility, and also increase the change with lapse of time.

These facts indicate that the carriers drifting through the insulating layer and the polycrystalline silicon surface are influenced strongly by the unevenness characteristic and therefore, it is essential for transistor characteristics as well as stability thereof to decrease the surface unevenness.

Next, description is to be made about the influence of the surface unevenness characteristic of the polycrystalline silicon thin film semiconductor layer on the characteristics of the lower gate type field effect transistor in which a semiconductor layer constituted of a polycrystalline silicon thin film is provided on an insulating layer for gate.

It has been now found that in a polycrystalline silicon thin film having a surface unevenness exceeding at its maximum 800 Å, amorphous silicon deficient in crystalline orientation or a minute crystal layer is grown in the vicinity of the substrate surface and, in the course of such growth, there occurs crystal grain growth expanding in the shape of a fan in the direction of film growth to increase unevenness as shown by photographs of film cross-sections.

Accordingly, the transistor characteristics of the lower gate type employing a polycrystalline silicon thin film having surface unevenness exceeding at its maximum 800 Å as a semiconductor layer constituting the main part of element are very small in effective carrier mobility, and the changes of transistor characteristics with lapse of time on continuous running are very great.

The polycrystalline silicon thin film which is formed with a surface unevenness of not more than 800 Å as disclosed in the present invention shows no marked difference in crystallinity and orientation characteristic in the direction of film thickness as the result of dense crystal growth from the substrate interface and can give also good transistor characteristics.

It is desirable to make the surface unevenness of the polycrystalline silicon film constituting the semiconductor layer as the main part to preferably 800 Å or less, in either upper or lower gate type field transistor, sistor, most preferably 500 Å or less.

In the present invention, measurement of the surface unevenness was conducted by means of a field radiation type scanning electron microscope (Model JFSM-30, produced by Nippon Denshi Co.) and it was determined from an image of 100,000 x magnification of the surface cross-section of a polycrystalline silicon thin film with accelerated electrons under 25 KV incident on the surface obliquely.

In the present invention, the surface unevenness of a polycrystalline silicon thin film constituting a semiconductor layer forming the main part of a semiconductor element is made 800 Å or less over the entier surface region of the semiconductor layer which constitutes actually the element.

As to the etching characteristic defined as an important element to achieve the object of the present invention, it has been determined by utilizing a part of polycrystalline silicon thin films prepared under various conditions for measurement of the etching rate by etching at an etching temperature of 25° C. with an etchant as defined below while on the other hand utilizing a remainder of the thin films to prepare FE-TFT (field effect thin film transistor) having a structure as shown in FIG. 1 for measurement of transistor characteristics, and establishing the correlation between the etching rate and said transistor characteristics.

As the etchant, there may be employed a mixture comprising a hydrofluoric acid commercially available usually as a chemical for electronic industries (50 vol.% aqueous solution), nitric acid (d=1.38, 60 vol. % aqueous solution) and glacial acetic acid at a volume ratio of 1:3:6.

The etchant has an etching characteristic that the etching rate is 15 Å/sec. when a silicon wafer with $\rho = 0.3$ $\Omega$. cm was subjected to etching with this etchant at 25° C.

From a number of experimental results obtained by the present inventors, it has been found that the etching rate of a polycrystalline silicon thin film differs variously depending on the film preparation conditions, namely, from 15 Å/sec. to 80 Å/sec. in case of the above etchant. When various TFT's were prepared with the use of various polycrystalline silicon thin films having different etching rates as semiconductor layers for examination of the correlation with the etching rate, the etching rate of a film affording preferable transistor characteristics has been found to be 20 Å/sec. or less. That is, a TFT of which the main part is constituted of a polycrystalline silicon thin film exceeding an etching rate of 20 Å/sec. has a mobility as small as 0.5 $cm^2$/V.sec. or less and transistor characteristics which greatly change with lapse of time.

Further, as described above, as the increase in orientation at the (220) plane in the polycrystalline thin film while satisfying both or either one of the requirements of hydrogen (H) content in said film and the surface unevenness characteristic, the transistor characteristics, especially effective carrier mobility, were found to be further improved from a number of experimental results obtained by the present inventors. It was also found that the change with lapse of time on continuous running decreases.

Crystallinity and orientation characteristics of polycrystalline silicon thin films depend on the film preparation method and the film preparation conditions.

In the present invention, as the method for examination of the orientation characteristics, X-ray diffraction and electron beam diffraction are performed in combination.

X-ray diffraction intensity of a polycrystalline silicon film prepared was measured by X-ray diffractometer produced by Rigaku Denki (copper tube bulb, 35 KV, 10 mA) and comparison was made. The diffraction angle 2 $\theta$ was varied from 20° to 65°, and diffraction peaks at plane indices of (111)plane, (220) plane and (311) were detected to determine their diffraction intensities.

Electron beam diffraction intensities were measured by JEM-100 V produced by Nippon Denshi Co., and respective diffraction intensities were determined similarly.

According to the ASTM card (No. 27-1402, JCPDS, 1977), in case of a polycrystalline silicon having no orientation at all, taking out only (220) from the planes in terms of (h, k, l) representation with large diffraction intensities of (111):(220):(311) = 100:55:30, its ratio to the total diffraction intensities, namely diffraction density of (220) / (total diffraction density) is equal to (55/241)×100≈22.8 (%).

With the use of this value as the standard, an orientation characteristic (220) with a greater value than the above percentage, especially 30 % or more, can give further improved transistor characteristics. At a value less than 30 %, the change with lapse of time becomes undesirably greater. In the present invention, as the value in terms of the above percentage representation, 50 % or more is most preferred.

Further, it has been also found that the transistor characteristics, especially effective carrier mobility, can be improved by increasing the average grain size and satisfying the requirements of the hydrogen (H) content in the polycrystalline silicone thin film and its surface unevenness characteristic as specified above. The value of the average grain size was determined according to the conventionally used Scherrer method from the half-value width of the (220) peak in the X-ray diffraction pattern as described above. The effective carrier mobility can be increased particularly at an average grain size of 200 Å or more. Most preferably, an average grain size is 300 Å or more.

The difference in grain sizes may be created frequently due to the different degree of growth depending on the film thickness. In case of a polycrystalline silicon thin film, the grain size difference due to the film thickness also differs depending on the preparation conditions. Accordingly, the film thickness may be suitably determined depending on the respective preparation methods.

In the present invention, the characteristics of the polycrystalline silicon thin film constituting the main part of the semiconductor element can be restricted as described above according to various film preparation methods.

For example, it can be realized under the specific conditions according to the method in which silicon hydride such as $SiH_4$, $Si_2H_6$, etc., is deposited by the glow discharge decomposition (GD), the method in which sputtering is effected using a Si target in a gas containing $H_2$ (SP), the method in which Si is subjected to electron beam vapor deposition in a $H_2$ plasma atmosphere (IP), the method in which vapor deposition is conducted in a $H_2$ atmosphere under ultra-high vacuum (HVD method), as well as the method in which a polycrystalline silicon film formed by CVD or LPCVD is subjected to $H_2$ plasma treatment, and so on. To be specifically noted in the present invention, the polycrystalline thin film semiconductor layer formed by the GD method, the SP method, the IP method and the HVD method, so long as it is formed at a low temperature of 350° C. to 450° C. while satisfying the requirements of the hydrogen content and the surface unevenness characteristic or the hydrogen content and the etching characteristc, can give transistor characteristics comparable to a polycrystalline silicon film known in the art, as prepared by, for example, CVD or LPCVD (at 600 C. or higher) followed by $H_2$ plasma annealing, and also give stability and reliability, thus indicating directly usefulness of the present invention.

As disclosed in the present invention, the formation of a polycrystalline silicon thin film suited for the object of the present invention is possible particularly by carrying out glow discharging of a silicon hydride compound gas, sputtering of silicon in $H_2$ atmosphere, ion plating, or ultra-high vacuum vapor deposition at a substrate surface temperature of 500° C. or lower (in the range of about 350° C. to 500° C.). This fact is not only advantageous in uniform heating of the substrate or provision of a cheap substrate material of large area in preparation of a driving circuit or a scanning circuit covering over a large area for a large area device, but also important in that it can satisfy the requirement to use a light-transmissive glass plate as a substrate for transmissive-type display device or in application of an image device such as in case of a photoelectric converting light-receiving element of the type in which light enters from the substrate side.

Accordingly, since the present invention can be practiced at lower temperature zones as compared with the prior art techniques, low melting glasses in general, heat-resistant plastics, etc., may also be available in addition to heat-resistant glasses such as high melting glasses, hard glass, and the like, heat-resistant ceramics, sapphire, spinel, silicon wafer, etc., conventionally used in the prior art.

As the glass substrate, there may be employed a regular glass having a softening point of 630° C., an ordinary hard glass having a softening point of 780° C., a ultra-hard glass having a softening point of 820° C. (JIS First grade ultra-hard glass), etc.

According to the present invention, the substrate temperature can be lower than the softening point of the substrate to be used, and therefore, the film can be formed on the substrate without deteriorating the substrate.

In examples of the present invention, there was primarily employed as the substrate glass Corning #7059 glass among the regular glasses (soda glasses) having relatively low softening points, but it is, of course, possible to use a quartz glass having a softening point of 1,500° C. as the substrate. However, from practical standpoint, the use of regular glasses is advantageous in preparation of an integrated semiconductor device comprising thin film transistors at low cost and over a large area.

In the present invention, the object of the present invention can be accomplished further effectively by making the polycrystalline silicon thin film semiconductor layer constituting the main part of the semiconductor element so as to have a X-ray or electron beam diffraction pattern in which the diffraction intensity from the plane of the plane index (220) is 30% or more of the diffraction intensity (total diffraction intensity) and also have an average crystal particle size of 200 Å or more.

According to the experience by the present inventors, it has been confirmed that the hydrogen content in the polycrystalline silicon thin film may be changed to a great extent depending on the film forming method and the film preparation conditions. For example, when a film is to be prepared by glow discharge of a silane gas such as $SiH_4$, and the like, the hydrogen content of the film may be changed variously depending on discharging power, pressure, substrate temperature, gas flow rate, degree of dilution of starting gas such as silane gas, the kind of diluting gas, and the like.

The change with lapse of time of the polycrystalline silicon thin film transistor for showing the effect of the present invention was performed according to the method as described below.

Figure 2:
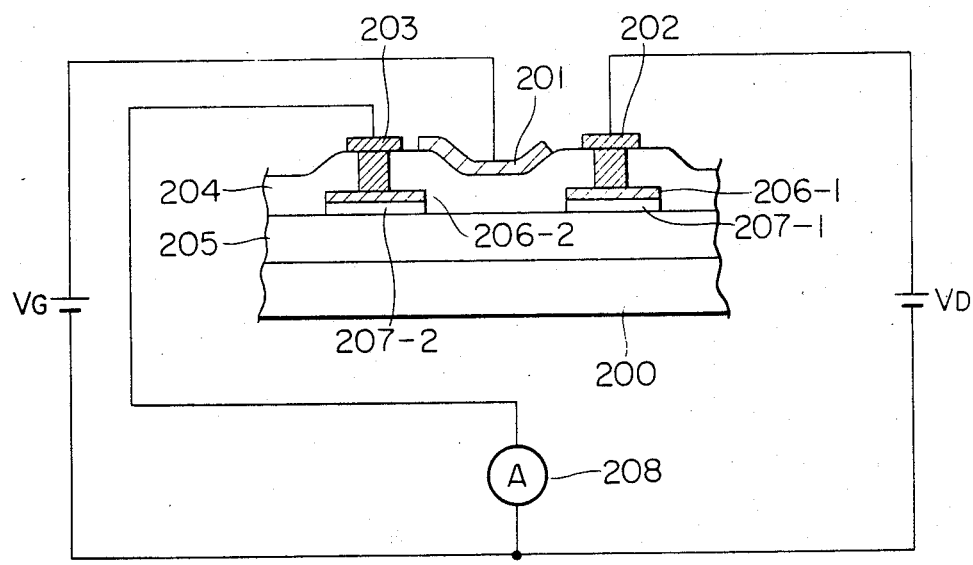
FIG. 2 is a schematic view for illustration of the circuit for measurement of the characteristics of the semiconductor element of the present invention.
Figure 3A:
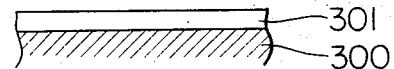
FIGS. 3A to 3G and FIGS. 5A to 5E each shows a schematic chart for illustration of the steps for preparation of one of the semiconductor elements of the present invention.
Figure 3B:
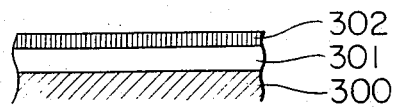
Figure 3C:
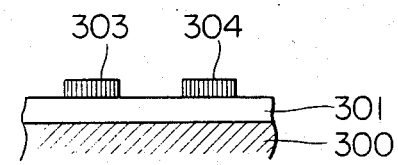
Figure 3D:
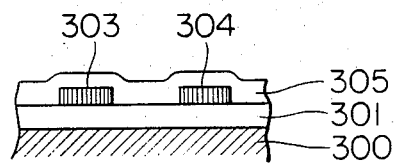
Figure 3E:
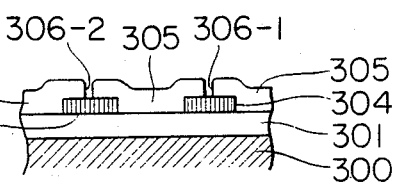
Figure 3F:
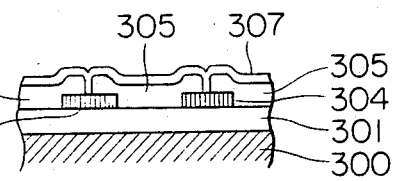
Figure 3G:
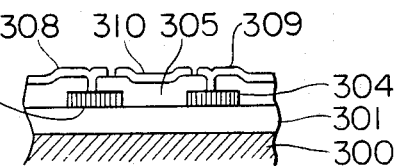

A TFT having a structure as shown in FIG. 2 was prepared, and by applying a gate voltage $V_G=40$ V to the gate 201 and a drain voltage $V_D=40$ V between the source 203 and the drain 202, the drain current $I_D$ flowing between source 203 and drain 202 was measured by an electrometer (Keithley 610 C electrometer) to measure the change of the drain current with lapse of time. The percentage of the change with lapse of time was determined by dividing the change of drain current after 500 hours' continuous running by the initial drain current and multiplying the value obtained by 100 so as to be represented in %.

According to a method conventionally conducted in MOS FET (Metal oxide semiconductor field effect transistor), the threshold voltage $V_{TH}$ of TFT was defined as the point at which the line extrapolated from the straight line portion in $$V_D - \sqrt{I_D}$$

curve cross over the abscissa of $V_D$. The changes of $V_{TH}$ before and after the change with lapse of time were examined at the same time and the changed quantity was represented in volt.

Now, referring to FIG. 3, a process for preparation of a TFT as an example of the semiconductor element of the present invention is described. TFT is a field effect transistor comprising a semiconductor layer 301, an electrode layer 307, ohmic contact layers 303, 304 and an insulating layer 305. A voltage is applied between the source electrode 308 and the drain electrode 309 provided adjacent to the semiconductor layer 301 and having ohmic contacts, and the current passing therebetween is modulated by the bias voltage applied to the gate electrode 310 provided on the insulating layer 305 [the structure is shown in FIG. 3, Step (g)]. First, after the substrate 300 was washed, a polycrystalline silicon thin film 301 is deposited thereon [Step (a)]. Details of the deposition method are described in respective Examples. Then, as the ohmic layer, n+ (P-doped silicon) layer 302 is deposited, the source and drain are formed by etching [Step (c)] and thereafter an insulating layer 305 is deposited thereon [Step (d)]. The insulating layer is constituted of a material such as silicon nitride, $SiO_2$, $Al_2O_3$, and the like formed by CVD, LPCVD, etc.

Next, the contact holes 306 for the source and drain electrodes are opened [Step (e)] and the upper electrode gate, the source and the drain are wired [Steps (f) and (g)] to complete the transistor.

As described above, the field effect thin film transistor (FE - TFT) as an example of the semiconductor element prepared from the polycrystalline silicon thin film as the base material has improved transistor characteristics (effective carrier mobility, threshold voltage, ON/OFF ratio, gm, etc.), without change of transistor characteristics with lapse of time on continuous running, and also has an improved yield of the element and less fluctuation of the characteristics, and therefore, it can provide stably a scanning circuit or a driving circuit of a display or image device utilizing LC, EL or EC.

In order to further illustrate the present invention, preparation of polycrystalline silicon thin films, preparation process of TFT and the results of TFT behaviors are described in detail below by way of the following Examples.

EXAMPLE 1

According to the procedure shown below, a polycrystalline silicon thin film was formed on a Corning glass (#7059) and field effect type transistor (TFT) was prepared with the use of said thim film.

In the following, referring is made to FIG. 3 and FIG. 4 in combination. Reference numerals in three hundreds are those in FIG. 3 and reference numerals in four hundreds are those in FIG. 4.

A Corning glass #7059 (120 mm × 120 mm, thickness: 0.7 mm) was ligthly etched with a mixture of $HF/HNO_3/CH_3COOH$, washed with running water and dried to prepare a substrate 400. The substrate 400 was fixed in close contact with the substrate heating holder 402 on the upper anode side in a bell-jar deposition chamber 401 as shown in FIG. 4. The bell-jar was evacuated by means of a diffusion pump 409 to a background vacuum degree of $2 \times 10^{-6}$ Torr, followed by heating of substrate heating holder 402 to maintain the surface temperature of the substrate 400 at 350° C. Subsequently, $SiH_4$ gas diluted to 10 vol. % with $H_2$ gas (abbreviated as "$SiH_4(10)/H_2$") was introduced through a ring-shaped gas blowing inlet 415 at a flow rate of 5 SCCM by use of a mass-flow controller 404 into the bell-jar 401, and the inner pressure in the bell-jar was controlled to 0.03 Torr by means of an absolute pressure gage 412 by closing the main valve 410. After the inner pressure in the bell-jar was stabilized, a voltage of 0.7 KV was applied by the high frequency power source 414 of 13.56 MHz on the lower cathode electrode 413 to excite gold discharge between the cathode 413 and the anode (substrate heating holder) 402. The current was 60 mA, with RF discharging power (travelling wave power-reflection wave power) being 20 W. The growth rate of a polycrystalline silicon film under those conditions was 0.25 Å/sec., and a film of about 0.4μ thickness was formed after growth for 4.5 hours.

The polycrystalline silicon film thus formed on the substrate 400 has a thickness distributed within the range of ±5%. The H content contained in the silicon layer was found to be 2.2%, and the unevenness on the polycrystalline surface was about 300Å at its maximum [as observed from the photograph of the cross-section of the film by electron microscope of 100,000×magnification]. As the next step, TFT was prepared along the steps as shown in FIG. 3. On the polycrystalline silicon thin film 301, in the same device, n+ layer 302 was formed as follows. After the substrate was adjusted to 250° C., $PH_3$ gas diluted to 100 vol. ppm with hydrogen gas (abbreviated as "$PH_3(100)/H_2$") was permitted to flow into the bell-jar 401 through the mass-flow meters 404 and 406 at a molar ratio of $PH_3/SiH_4$ of $5 \times 10^{-3}$ relative to the $SiH_4(10)/H_2$ gas to adjust the inner pressure in the bell-jar at 0.12 Torr, whereupon glow discharge was effected at 10 W to form the n+ layer 302 doped with P to a thickness of 500 Å [Step (b)]. Then, according to the Step (c), the n+ layer was removed by photoetching except for the region for the source electrode 303 and the region for the drain electrode 304. Again, the above substrate was fixed on the heating holder 402 on the anode side in the bell-jar 401 so as to form a gate insulating film. Similarly as in preparation of the polycrystalline silicon, the bell-jar 401 was evacuated, the substrate temperature Ts maintained at 250° C. and $NH_3$ gas was introduced at a flow rate of 20 SCCM and $SiH_4(10)/H_2$ gas at a flow rate of 5 SCCM through mass-flow meters 405 and 404, respectively, into the bell-jar, whereupon glow discharge was excited at 5 W to deposit a SiNH film 305 to a thickness of 2500 Å.

Next, contact holes 306-2 and 306-1 for the source electrode 303 and the drain electrode 304 were opened by the photoetching step, and thereafter an electrode flim 307 was formed on the entire surface of the SiNH film by vapor deposition of Al, followed by working of the Al electrode film 307 by the photoetching step to form the lead-out electrode 308 for the source and the gate electrode 310. Thereafter, heat treatment was conducted at 250° C. in $H_2$ atmosphere. The TFT (channel length L=10μ, channel width W=500μ) formed according to the process under the conditions as described above was found to exhibit stable and good characteristics.

Figure 6:
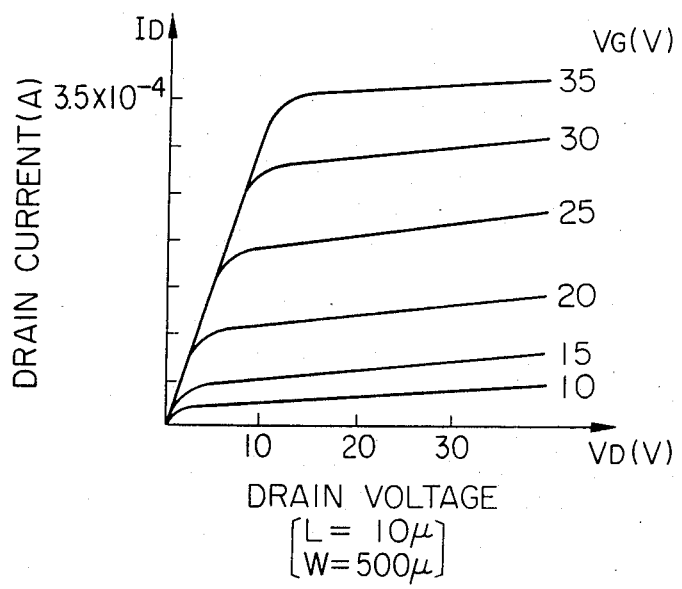
FIG. 6, FIG. 9 and FIG. 10 each shows a graph for illustration of one example of $V_D$-$I_D$ characteristic of the semiconductor element of the present invention.
Figure 5A:
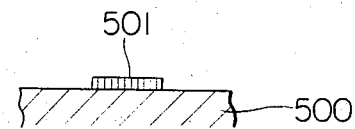
Figure 5B:
Figure 5C:
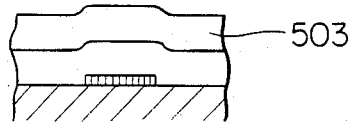
Figure 5D:
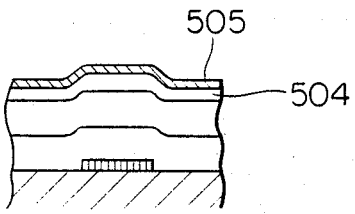
Figure 5E:
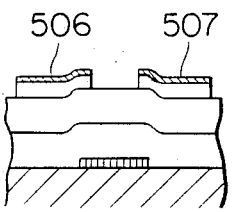

FIG. 6 shows exemplary characteristics of the thus prepared TFT. In FIG. 6, there are shown exemplary characteristics of the relation between the drain current $I_D$ and the drain voltage $V_D$ with the gate voltage $V_G$ being changed as parameter. The threshold voltage (Vth) of the gate is as low as 5 V, and the ratio of the current value at $V_G=20$ V to that at $V_G=0$ can be a number in 4 or more figures. The element had an effective mobility (μeff) of 0.3 (cm$^2$/V.sec). When the changes of $I_D$ (drain current) and Vth were measured under the conditions of $V_G=40$ V and $V_D=40$ V, $I_D$ was changed by 0.1% or less, and Vth entirely unchanged after 500 hours, thus indicating good DC behavior characteristics without change with lapse of time.

Among the TFT elements of the same shape on the Corning glass of 120 mm×120 mm, those failing to exhibit sufficient element characteristics due to gate leak amounted to only 0.2% or less, which is within a practically acceptable range.

EXAMPLE 2

In forming a polycrystalline silicon film on a Corning glass in the same manner as in Example 1, there were employed the conditions of a substrate surface temperature of 380° C., a $SiH_4(10)/H_2$ gas flow rate of 2 SCCM, a bell-jar inner pressure of 0.015 Torr and a RF power of 10 W. The growth rate of the polycrystalline silicon film under these conditions was 0.07Å/sec, whereby about 0.1μ film was formed after 4 hours of growth. The H content in the silicon layer was found to be 0.8 atomic %, and the unevenness on the silicon film surface was about 100Å at its maximum.

Subsequently, following the same steps [(a)–(g)] as in Example 1, TFT was prepared. The element had an effective mobility (μeff) of 1.6 (cm$^2$/V.sec). When the changes of $I_D$ and Vth were measured under the conditions of $V_G=40$ V and $V_D=40$ V, $I_D$ was changed by 0.1% or less, the Vth entirely unchanged after 500 hours, thus indicating good DC behavior characteristics without change with lapse of time.

The gate leak percentage of the TFT elements failing to exhibit sufficient element characteristics among those of the same shape on the Corning glass of 120 mm×120 mm was found to be substantially zero.

EXAMPLE 3

After a vapor-deposited film of Mo (Electron beam vapor deposition, 1000 Å thick) was provided on a Corning glass 500 as shown in the Step (a) in FIG. 5, a gate electrode 501 was formed to a desired shape by photolithography to prepare a substrate. Subsequently, a SiNH film 502 was formed to a thickness of 2,500Å under the same conditions as in Example 1 [Step (b)], and further a polycrystalline silicon thin film 503 was formed under the same conditions as in Example 2 in the thickness of 0.1μ [Step (c)]. Further, on the thin film 503, there was prepared a n+ layer 504 of 500 Å thick similarly to in Example 1, followed by lamination of an Al vapor-deposited film 505 in the thickness of 1,500 Å [Step (d)]. Again, according to the photolithographic method, source and drain electrodes 506, 507 were formed [Step (e)], followed by heat treatment at 250° C. in H₂ atmosphere. The TFT (channel length L=10μ, channel width W=500μ) formed according to the process under the conditions as described above was found to exhibit stable and good characteristics. The threshold voltage (Vth) of the gate was as low as 3 V, and the ratio of the $I_D$ current value at $V_G=20$ V to that at $V_G=0$ was more than 1000. The element had an effective mobility (μeff) of 0.9 (cm²/V. sec.). When the changes of $I_D$ (drain current) and Vth were measured under the conditions of $V_G=40$ V and $V_D=40$ V, $I_D$ was changed by 0.1% or less, and Vth entirely unchanged after 500 hours.

EXAMPLE 4

A similar Corning glass substrate 400 prepared in the same manner as described in EXAMPLE 1 was fixed in close contact on the substrate heating holder 402 on the upper anode side in the bell-jar 401, and a polycrystalline silicon plate (not shown : 99.9999%) was placed on the electrode plate of the lower cathode 413 so as to confront the substrate. The bell-jar 401 was evacuated by the diffusion pump 409 to $2 \times 10^{-6}$ Torr and the substrate heating holder 402 was heated to maintain the surface temperature of the substrate 400 at 450° C. Subsequently, a high purity H₂ gas was introduced into the bell-jar at 0.5 SCCM through the mass-flow meter 408, further a gas mixture of Ar/He (5/95 vol. ratio) was introduced into the bell-jar at a flow rate of 50 SCCM through the mass-flow meter 407, followed by controlling the main valve 410 to set the inner pressure in the bell-jar at 0.05 Torr. After stabilization of the inner bell-jar pressure, a voltage of 2.0 KV was applied to the lower cathode electrode 413 by the high frequency power source 414 of 13.56 MHz to excite glow discharge between the polycrystalline silicon plate on the cathode 413 and the anode (substrate heating holder) 402. RF discharging power (travelling wave power reflection wave power) was 200 W. The growth rate of the silicon film under these conditions was 0.3 Å/sec, whereby about 0.4μ thick film was formed after 4 hours of growth.

The H content in the silicon layer was found to be 0.2 atomic % and the unevenness on the silicon film surface was at its maximum about 400 Å, as observed from electron microscope photography (×100,000) of the cross-section of the film.

Subsequently, similarly as in EXAMPLE 1, following the same steps [(a)-(g)] as shown in FIG. 3, a TFT was prepared. The element had an effective mobility (μeff) of 1.0 (cm²/V.sec). When the changes of $I_D$ and Vth were measured under the conditions of $V_G=40$ V and $V_D=40$ V, $I_D$ was changed by 0.1% or less, and Vth entirely unchanged after 500 hours, thus indicating good DC behavior characteristics without change with lapse of time.

The gate leak percentage of the TFT elements failing to exhibit sufficient element characteristics among those of the same shape on the Corning glass of 120 mm×120 mm was found to be 0.2%, which was within the practically usable range.

EXAMPLE 5

In forming the silicon film on a Corning glass according to the same method as in EXAMPLE 4, various silicon film of a thickness of 0.4μ having respective H contents and surface unevenness characteristics were prepared by varying the H₂ gas flow rate relative to 50 SCCM of Ar/He (5/95 vol. ratio) as shown in Table 1. By use of the respective silicon films, TFT were prepared following the same procedure as in EXAMPLE 1 to obtain the results as shown in Table 1.

TABLE 1

| Sample No. | 5-1 | 5-2 | 5-3 | 5-4 | 5-5 |
|---|---|---|---|---|---|
| H₂ flow rate (SCCM) | 0 | 0.1 | 0.5 | 5 | 50 |
| Hydrogen content (atomic %) | 0 | 0.01 | 0.2 | 3 | 6 |
| Unevenness characteristic (Å) | 350 | 350 | 400 | 400 | 500 |
| μeff (cm²/V.sec) | ≃10⁻³ | 0.5 | 1.4 | 1.3 | 0.9 |
| Change with lapse of time* (%) | <0.1 | <0.1 | <0.1 | 0.2 | 26 |

*The change with lapse of time is a value as defined in Example 1, namely $[I_D(0)-I_D(500)]/I_D(0)$, at $V_G = V_D = 40$ V, 500 hours, where $I_D(0)$ is initial drain current and $I_D(500)$ drain current after 500 hours.

As shown in Table 1, a silicon film with a hydrogen content of 0.01 atomic % or more had a good effective mobility of carrier, while element characteristics with very small change with lapse of time were obtained as 3 atomic % or less.

EXAMPLE 6

In forming the polycrystalline silicon film on a Corning glass according to the same method as in Example 1, the inner pressure in the bell-jar (Pr) was varied as shown in Table 2 to obtain various films with a thickness of about 0.4μ, having H contents, surface unevenness characteristics and TFT characteristics as shown in Table 2.

TABLE 2

| Sample No. | 6-1 | 6-2 | 6-3 | 6-4 | 6-5 |
|---|---|---|---|---|---|
| Pressure Pr (Torr) | 0.01 | 0.02 | 0.04 | 0.08 | 0.16 |
| Hydrogen content (atomic %) | 1.8 | 2.0 | 2.2 | 2.2 | 2.4 |
| Unevenness characteristic (Å) | 150 | 200 | 300 | 800 | 1200 |
| μeff (cm²/V.sec) | 1.4 | 1.3 | 1.3 | 0.7 | 0.2 |
| Gate leak percentage (%) | 0.1 | 0.2 | 0.2 | 0.4 | 33 |

As shown in Table 2, when the polycrystalline silicon thin film has an unevenness of 800 Å or less, the gate leak percentage is within practical range and TFT is also good with respect to carrier effective mobility.

EXAMPLE 7

As described in EXAMPLE 3, using a substrate having a Mo gate electrode, SiNH film was laminated similarly on said Mo gate electrode to a thickness of 2500 Å. Further, the bell-jar inner pressure (Pr) was varied similarly as in EXAMPLE 6 to laminate various polycrystalline silicon thin films each of about 0.4μ thickness, followed by lamination of n+ layers and Al films, and thereafter TFT's were preapred according to the photolithographic step to obtain the results as shown in Table 3.

TABLE 3

| Sample No. | 7-1 | 7-2 | 7-3 | 7-4 | 7-5 |
|---|---|---|---|---|---|
| Pr (Torr) | 0.01 | 0.02 | 0.04 | 0.08 | 0.16 |
| Hydrogen content (atomic %) | 1.8 | 2.0 | 2.2 | 2.2 | 2.4 |
| Unevenness characteristic (Å) | 150 | 200 | 300 | 800 | 1200 |
| $\mu\text{eff}$ (cm$^2$/V.sec) | 0.7 | 0.6 | 0.6 | 0.4 | 0.02 |
| Change with lapse of time (%) | <0.1 | <0.1 | <0.1 | 0.5 | 3.5 |

As shown in Table 3, when the polycrystalline silicon thin film formed has an unevenness of 800 Å or less, good results are obtained with respect to the effective carrier mobility as well as the change with lapse of time in behaviours on continuous running for 500 hours.

EXAMPLE 8

In forming the polycrystalline silicon film on a Corning glass according to the same method as in Example 1, the input RF power (Po) was changed as shown in Table 4 to obtain various films with a thickness of about 0.4μ, having H contents, surface unevenness characteristics, (220) orientation strength and TFT characteristics as shown in Table 4.

TABLE 4

| Sample No. | 8-1 | 8-2 | 8-3 | 8-4 | 8-5 |
|---|---|---|---|---|---|
| Po (W) | 10 | 20 | 50 | 100 | 150 |
| Hydrogen content (atomic %) | 2.0 | 2.2 | 2.0 | 2.6 | 3.0 |
| Unevenness characteristic (Å) | 300 | 300 | 350 | 350 | 350 |
| (220) plane orientation characteristic (%) | 68 | 65 | 52 | 30 | 27 |
| $\mu\text{eff}$ (cm$^2$/V.sec) | 2.2 | 1.3 | 1.0 | 0.6 | 0.2 |
| Change with lapse of time (%) | <0.1 | <0.1 | <0.1 | 0.3 | 2 |

As shown in Table 4, at an orientation of less than 30%, TFT is lowered in carrier effective mobility and change with lapse of time increases.

EXAMPLE 9

In forming the polycrystalline silicon film on a Corning glass according to the same method as in Example 1, the film growth time was varied to obtain the film growth time was varied to obtain films with respective thicknesses (d) as shown in Table 5, having H contents, surface nuevenness characteristics, (220) orientation strength, average size and TFT characteristics as shown in Table 5.

TABLE 5

| Sample No. | 9-1 | 9-2 | 9-3 | 9-4 | 9-5 |
|---|---|---|---|---|---|
| Thickness d (μ) | 0.1 | 0.2 | 0.4 | 0.6 | 0.8 |
| Hydrogen content (atomic %) | 2.2 | 2.0 | 2.2 | 2.3 | 2.2 |
| Unevenness characteristic (Å) | 220 | 250 | 300 | 300 | 300 |
| Average grain size (Å) | 160 | 200 | 340 | 460 | 550 |
| $\mu\text{eff}$ (cm$^2$/V.sec) | 0.4 | 0.6 | 1.3 | 1.5 | 2.6 |

As shown in Table 5, with a grain size of 200 Å or more, TFT can have good carrier effective mobility.

EXAMPLE 10

Figure 7:
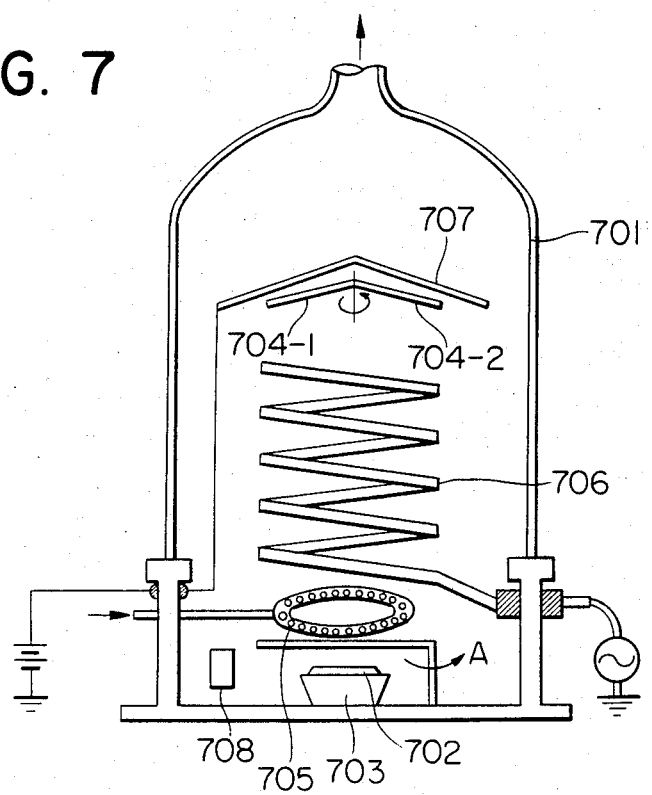

An example of a thin film transistor is described below, which is formed by use of a polycrystalline silicon thin film semiconductor layer prepared by the ion-plating deposition device as shown in FIG. 7.

First, in a deposition chamber 701, which can be brought to reduced pressure, there was placed a non-doped polycrystalline silicon body to be evaporated 702 in a boat 703 and a Corning #7059 substrate was set on the supports 704-1 and 704-2. After the deposition chamber was evacuated to a base pressure of about $1 \times 10^{-7}$ Torr, H$_2$ gas with a purity of 99.999 % was introduced through the gas inlet tube 705 into the deposition chamber to a hydrogen partial pressure P$_H$ of $3 \times 10^{-5}$ Torr. The gas inlet tube employed had an inner diameter of 2 mm and shaped at its tip in a loop having gas blowing openings of 0.5 mm in diameter at intervals of 2 cm.

Then, high frequency of 13 56 MHz was applied to the high frequency coil 706 (5 mm in diameter) to set the output at 40 W, whereby a high frequency plasma atmosphere was formed inside of the coil. On the other hand, while rotating the supports 704-1 and 704-2, the heating device 707 had been brought to the state under actuation and heated to about 430° C.

As the next step, the evaporating body 702 was irradiated and heated by the electron gun 708, thereby permitting silicon particles to fly. The electron gun had a power of about 0.3 KW.

Thus, a polycrystalline silicon thin film of 4000 Å was formed after 2 hours. With the use of this thin film, a thin film transistor was prepared according to the same process as in Example 1. The H content in the polycrystalline silicon layer was found to be 0.5 %, while the unevenness on the polycrystalline silicon film surface about 450 Å. This element had an effective mobility ($\mu\text{eff}$) of 1.1 (cm$^2$/V.sec) When the changes of I$_D$ and Vth were measured under the conditions of V$_G$ =40 V and V$_D$=40 V, I$_D$ was changed by 0.1 % or less, and Vth entirely unchanged after 500 hours, thus indicating good DC behavior characteristic without changes with lapse of time.

The gate leak percentage of the TFT elements failing to exhibit sufficient element characteristics among those of the same shape on the Corning glass of 120 mm × 120 mm was found to be 0.3 %, which was within the practically usable range.

EXAMPLE 11

Figure 8:
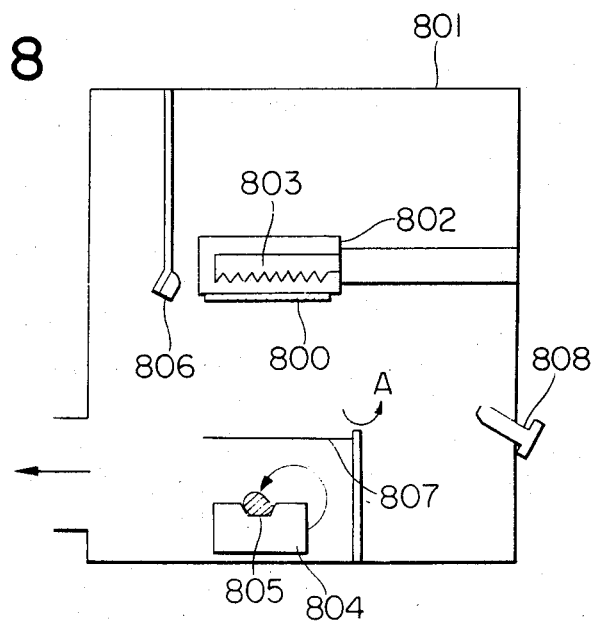

A Corning #7059 glass substrate 800 prepared similarly as in Example 1 was mounted on a substrate holder 802 in the ultra-high vacuum tank 801 as shown in FIG. 8, and after reduction of the pressure in the vacuum tank to a pressure of $2 \times 10^{-10}$ Torr, the substrate temperature was set at 400° C. by the tantalum heater 803. Subsequently, high purity hydrogen gas (99.9999 %) was introduced into the vacuum tank through the variable leak valve 808 to set the pressure in the vacuum tank at $5 \times 10^{-7}$ Torr. Then, the electron gun 804 was actuated under an acceleration voltage of 8 KV, and the electron beam emitted irradiated the silicon evaporating body 805 to evaporate the silicon evaporating body, followed by opening of the shutter 807 to form a polycrystalline silicon film on the substrate 800, while controlling the film thickness by means of the quartz oscillator thickness meter 806 to 0.4μ thickness. The vapor deposition rate was 1.4 Å/sec. With the use of this thin film, a thin film transistor was prepared according to the same process as in Example 1. The H content in the polycrystalline silicon layer was found to be 0.15 atomic %, while the unevenness on the polycrystalline silicon film surface about 300 Å. This element had an effective mobility ($\mu$eff) of 2.1 (cm$^2$/V.sec). When the changes of $I_D$ and Vth were measured under the conditions of $V_G=40$ V and $V_D=40$ V, $I_D$ was changed by 0.1 % or less, and Vth entirely unchanged after 500 hours, thus indicating good DC behavior characteristics without change with lapse of time.

The gate leak percentage of the TFT elements failing to exhibit sufficient element characteristics among those of the same shape on the Corning glass of 120 mm × 120 mm was found to be 0.2 %, which was within the practically usable range.

EXAMPLE 12

In this Example, a polycrystalline silicon thin film was formed by the glow discharge decomposition method on a substrate and TFT was prepared with the use thereof. Preparation of the polycrystalline silicon thin film was performed by using the device as shown in FIG. 4. As the substrate 400, there was employed a Corning glass #7059 (thickness: 0.5 mm).

First, the substrate 400 was washed and lightly etched on its surface with a mixture of HF/HNO$_3$/CH$_3$COOH having the aforesaid composition and dried and mounted on the substrate heating holder 402 (area 452 cm$^2$) on the upper anode side in a belljar deposition chamber 401. The bell-jar 401 was evacuated by means of a diffusion pump 409 to a background vacuum degree of 2.0×10$^{-6}$ Torr or less. This operation must be done carefully because no effective film precipitation of the reactive gas may be possible when the background pressure is not sufficiently low and moreover O, N may be entrained in the film to change markedly the resistance of the film. Then, the substrate 400 was maintained at 500° C. by elevation of Ts (the substrate temperature was monitored by the thermocouple 403). Next, H$_2$ gas was introduced into the bell-jar 401 under the control with the mass-flow controller 408 for cleaning of the surface of the substrate 400 to be ready for introduction of a reactive gas. The substrate temperature Ts was set at 350° C. The pressure in the bell-jar 401 at the time of discharging was adjusted to 0.12 Torr.

In said Example, as the reactive gas to be introduced, there was employed SiH$_4$ gas diluted to 3 vol.% with H$_2$ gas (abbreviated as "SiH$_4$ (3)/H$_2$") which was easy in handling. The flow rate of gas was set at 5 SCCM by use of a mass-flow controller 404. The inner pressure in the bell-jar 401 was controlled to a desired pressure by means of an absolute pressure gage 412 by controlling the pressure controlling valve 410 on the evacuation side of the bell-jar 401. After the inner pressure in the bell-jar 401 was stabilized, a high frequency field of 13.56 MHz was applied to the cathode electrode 413 by the high frequency power source 414 to commence glow discharge. The voltage was 0.7 KV, the current 60 mA, and RF discharging power 20 W. Discharging was continued under these conditions for 60 minutes to complete formation of a polycrystalline silicon film followed by stopping of discharge as well as inflow of the starting gas. Then, the substrate temperature was lowered to 180° C. and maintained thereat to be ready for the next process.

The deposition rate of the polycrystalline silicon under these conditions was 0.9 Å/sec. The film formed had a thickness of 300 Å, and when using a circular ring-type blowing outlet its uniformity was within ±10% for the size of 3 inch×3 inch of the substrate.

The polycrystalline silicon film was of n-type, having a resistance value of $\simeq 10^7$ ohm.cm. Next, with the use of this film, a thin film transistor (TFT) was prepared according to the steps as shown in FIG. 3. While maintaining the substrate temperature at 180° C. in order to make good ohmic contact of the source, drain of TFT, n+silicon layer was formed as follows. PH$_3$ gas diluted to 100 vol. ppm with hydrogen gas (abbreviated as "PH$_3$ (100)/H$_2$") was permitted to flow into the bell-jar 401 at a molar ratio of PH$_3$/SiH$_4$ of 5×10$^{-3}$ relative to SiH$_4$ gas diluted with H$_2$ to 10 vol.% (abbreviated as "SiH$_4$ (10)/H$_2$") to adjust the inner pressure in the bell-jar 401 to 0.12 Torr, whereupon glow discharge was effected at 10 W to for n= layer 302 doped with P to a thickness of 500 Å (step (b)).

Then, Al was vapor deposited and thereafter according to the Step (c), Al and the n+ layer 302 was removed by photoetching except for the region for the source electrode 303 and the region for the drain electrode 304. Again, the above substrate was fixed on the heating holder 402 on the anode side in the bell-jar 401 so as to form a gate insulating film. Similarly as in preparation of the polycrystalline silicon, the bell-jar 401 was evacuated, the substrate temperature Ts was maintained at 250° C., and NH$_3$ gas was introduced at a flow rate of 20 SCCM, and SiH$_4$ (10)/H$_2$ gas was introduced at flow rate of 5 SCCM, whereupon glow discharge was excited to deposit a SiNH film 305 to a thickness of 2500 Å.

Next, contact holes 306-2 and 306-1 for the source electrode 303 and the drain electrode 304 were opened by the photoetching step, and thereafter an electrode film 307 was formed on the entire surface of the SiNH film 305 by vapor deposition of Al, followed by working of the Al electrode film 307 by the photoetching step to form the lead-out electrode 308 for the source electrode, the lead-out electrode 309 for the drain electrode and the gate electrode 310. Thereafter, heat treatment was conducted at 250° C. in H$_2$ atmosphere. The TFT (channel length L=20μ, channel width W=650μ) formed according to the process under the conditions as described above was found to exhibit stable and good characteristics.

Figure 9:
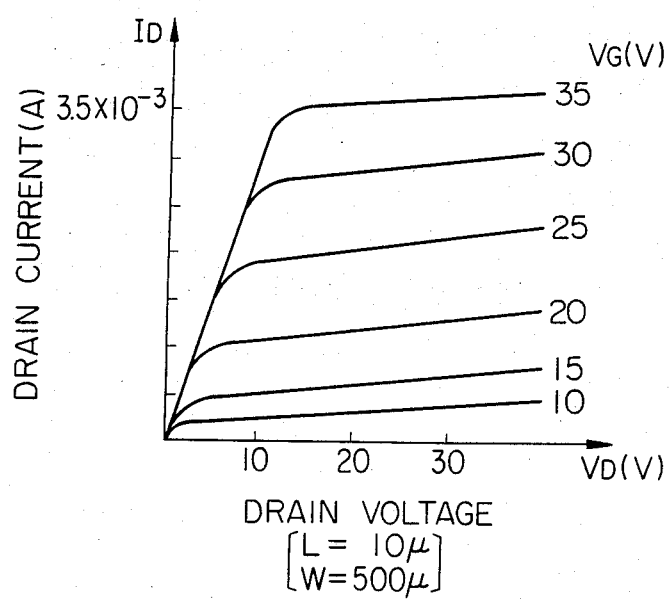

FIG. 9 shows exemplary characteristics of the thus prepared TFT. In FIG. 9, there are shown exemplary TFT characteristics of the relation between the drain current $I_D$ and the drain voltage $V_D$ with the gate voltage $V_G$ being changed as parameter. The threshold voltage of the gate is as low as 5 V, and the ratio of the $I_D$ current value at $V_g=20$ V to that at $V_G=0$ can be more than 1000. In Table 6, there are shown the results of measurement of hydrogen contents in polycrystalline silicon thin films used for preparation of TFT according to the same procedure as described above and the results of measurement of the etching rate of said polycrystalling silicon thin film with a mixture of hydrofluoric acid, nitric acid and glacial acetic acid (vol. ratio=- hydrofluoric acid:nitric acid:glacial acetic acid=1:3:6). In these experiments, only the substrate temperature Ts was varied at 500° C., 450° C. and 400° C., with other conditions being the same. Also shown in the same Table are effective mobilities ($\mu$eff) of TFT prepared with the use of these polycrystalline silicon thin films. The film prepared at a high substrate temperature of Ts=500° C. had a small hydrogen content of 0.5 atomic % in the film and etching ratio was as small as 15 Å/sec, and TFT prepared with the use of this film had a $\mu$eff of 8 cm$^2$/V.sec as well as good characteristics showing no change with lapse of time.

In this Example, Corning #7059 glass was used as a substrate, but similar characteristics could be obtained at higher heat treatment temperature or substrate temperature by employment of ultra-hard glass or quartz glass.

According to the present invention, the substrate temperature Ts can be selected from a wide range of temperature so that the substrate material can be selected from a wide range of materials. For example, even an inexpensive material of low melting point may be used as a substrate, and excellent TFT integrated circuits can be fabricated at lower cost. In addition, the TFT integrated circuits can be produced by means of a simpler apparatus.

TABLE 6

| Sample No. | 12-1 | 12-2 | 12-3 |
|---|---|---|---|
| Substrate temperature Ts (°C.) | 400 | 450 | 500 |
| Hydrogen content (atomic %) | 1.7 | 1.3 | 0.5 |
| Etching rate (Å/sec) | 18 | 16 | 15 |
| $\mu$eff (cm$^2$/V.sec) | 2.8 | 5 | 8 |
| Discharging power | 20 W | | |
| SiH$_4$ gas concentration | 3 vol. % | | |
| Flow rate (FR) | 5 SCCM | | |
| Pressure (Pr) | 0.05 Torr | | |

EXAMPLE 13

According to the same procedure as in Example 12, polycrystalline silicon films were formed at various substrate temperatures for flow discharge decomposition of 400, 450 and 500° C. and under the constant conditions of a RF discharging power of 50W, a silane gas flow rate (SiH$_4$(3)/H$_2$) of 10 SCCM and a pressure of 0.05 Torr, and TFT,s were prepared with the use of these films. The relations between the characteristic of TFT ($\mu$eff) and hydrogen content, etching rate and orientation of the base material are shown in Table 7.

TABLE 7

| Sample No. | 13-1 | 13-2 | 13-3 |
|---|---|---|---|
| Substrate temperature Ts (°C.) | 400 | 450 | 500 |
| Hydrogen content (atomic %) | 2 | 1.8 | 0.8 |
| Etching rate (Å/sec) | 20 | 18 | 18 |
| Orientation by diffraction strength (%) | 45 | 50 | 58 |
| $\mu$eff (cm$^2$/V.sec) | 2.5 | 4.6 | 6.2 |
| Discharging power | 50 W | | |
| SiH$_4$ gas concentration | 3 vol. % | | |
| Flow rate (FR) | 10 SCCM | | |
| Pressure | 0.05 Torr | | |

EXAMPLE 14

According to the same procedure as in Example 12, polycrystalline silicon films were formed at various substrate temperatures (Ts) for flow discharge decomposition of 400, 450 and 500? C. and under the constant conditions of a discharging power of 100 W, a (SiH$_4$(3)/H$_2$) gas flow, rate of 10 SCCM and a pressure of 0.05 Torr, and TFT s were prepared with the use of these films. The relations between the characteristic of TFT ($\mu$eff) and hydrogen content, etching rate and orientation of the base material are shown in Table 8.

TABLE 8

| Sample No. | 14-1 | 14-2 | 14-3 |
|---|---|---|---|
| Substrate temperature, Ts (°C.) | 400 | 450 | 500 |
| Hydrogen content (atomic %) | 3 | 2.5 | 1 |
| Etching rate (Å/sec) | 23 | 20 | 20 |
| Average particle size of crystals (Å) | 120 | 550 | 850 |
| $\mu$eff (cm$^2$/V.sec) | 1.0 | 4.2 | 5.5 |

The above transistor had good characteristics showing no change with lapse of time, with $\mu$eff being 5.5, when the substrate temperature was 500° C. (Sample No. 14-3).

EXAMPLE 15

A similar Corning glass substrate 400 prepared in the same manner as described in Example 12 was fixed in close contact on the substrate heating holder 402 on the upper anode side in the bell-jar 401, and a polycrystalline silicon plate (not shown: 99.99%) was placed on the electrode plate of the lower cathode 413 so as to confront the substrate. The bell-jar 401 was evacuated by the diffusion pump 409 to 2×10$^{-6}$ Torr and the substrate heating holder 402 was heated to maintain the surface temperature of the substrate 400 at 450° C. Subsequently, a high purity H$_2$ gas was introduced into the bell-jar at 0.5 SCCM through the mass-flow meter 408, further a gas mixture of Ar/He (5/95 vol.ratio) was introduced into the bell-jar 401 at a flow rate of 50 SCCM through the mass-flow meter 407, followed by controlling the main valve 410 to set the inner pressure in the bell-jar at 0.05 Torr.

After stabilization of the inner bell-jar pressure, a voltage of 1.5 KV was applied to the lower cathode electrode 413 by the high frequency power source 414 of 13.56 MHz to excite glow discharge between the polycrystalline silicon plate on the cathode 413 and the anode (substrate heating holder) 402. RF discharging power (travelling wave power - reflection wave power) was 120 W. The growth rate of the polycrystalline silicon film under these conditions was 0.2 Å/sec, whereby about 0.3$\mu$ thick film was formed after 4 hours of growth.

The H content in the polycrystalline silicon layer was found to be 0.5 atomic %, and the etching rate was 19 Å/sec.

Subsequently, following the same steps [(a)-(g)] as in Example 12, TFT was prepared. The element had an effective mobility ($\mu$eff) of 1.0 (cm$^2$/V.sec) When the changes of I$_D$ and Vth were measured under the conditions of V$_G$=40 V and V$_D$=40 V, I$_D$ was changed by 0.1% or less, and Vth entirely unchanged after 500 hours, thus indicating good DC behavior characteristics without change with lapse of time.

EXAMPLE 16

A Corning #7059 glass substrate 800 prepared similarly as in Example 12 was mounted on a substrate holder 802 in the ultra-high vacuum tank 801 which can be reduced to a pressure of $2\times10^{-11}$ Torr as shown in FIG. 8, and after reduction of the pressure in the vacuum tank 801 to a pressure less than $5\times10^{-11}$ Torr, the substrate temperature was set at 350° C. by the tantalum heater 803. Subsequently, the electron gun 804 was actuated under an acceleration voltage of 8 KV, and the electron beam emitted irradiated the silicon evaporating body 805 to evaporate the silicon evaporating body, followed by opening of the shutter 807 to form a polycrystalline silicon film of $0.5\mu$ thick on the substrate 800, while controlling the film thickness by means of the quartz oscillator thickness meter 806. The pressure during the vapor deposition was $1\times10^{-9}$ Torr, and the vapor deposition rate was 1.4 Å/sec (Sample No. 16-1).

On the other hand, a washed Corning #7059 glass substrate was again fixed on the substrate holder 802, and after evacuation to the inner pressure in the vacuum tank 801 of lower than $5\times10^{-11}$ Torr, a high purity hydrogen gas (99.9999%) was introduced into the vacuum tank through the variable leak valve 808 to set the inner pressure in the tank 801 at $5\times10^{-11}$ Torr. The substrate temperature was set at 400° C., and the electron gun 804 was controlled so that the vapor deposition rate was 1.0 Å/sec to form a polycrystalline silicon thin film of a thickness of $0.5\mu$ (Sample No. 16-2).

For Samples No. 16-1 and No. 16-2, hydrogen contents, etching rates, orientation characteristics as well as effective mobility $\mu$eff of TFT prepared according to the same procedure as in Example 12 are shown in Table 9.

TABLE 9

| Sample No. | 16-1 | 16-2 |
|---|---|---|
| Hydrogen content (atomic %) | <0.01 | 0.5 |
| Etching rate (Å/sec) | 20 | 20 |
| Orientation characteristic (%) | 41 | 40 |
| $\mu$eff (cm$^2$/V.sec) | 0.4 | 5.7 |

As can be seen from Table 9, Samples No. 16-1 and 16-2 both exhibited good characteristics with the same values of etching rate and orientation characteristic. As for effective mobility ($\mu$eff), Sample No. 16-2 was greater by one place than Sample No. 16-1, thus indicating superiority of Sample No. 16-2 as a semiconductor layer for TFT.

EXAMPLE 17

An example is to be described below, in which a polycrystalline silicon thin film is prepared by the ion-plating deposition device as shown in FIG. 7 and a thin film transistor is prepared from said thin film as base material.

First, in a deposition chamber 701 which can be brought to reduced pressure, there was placed a non-doped polycrystalline silicon body to be evaporated 702 in a boat 703, and a Corning #7059 glass substrate was set on the supports. After the deposition chamber was evacuated to a base pressure of about $1\times10^{-7}$ Torr, H$_2$ gas with a purity of 99.999% was introduced through the gas inlet tube 705 into the deposition chamber 701 to a hydrogen partial pressure $P_H$ of $1\times10^{-4}$ Torr. The gas inlet tube 705 employed had an inner diameter of 2 mm and shaped at its tip in a loop having gas blowing openings of 0.5 mm at intervals of 2 cm.

Then, high frequency of 13.56 MHz was applied to the high frequency coil 706 (5 mm in diameter) to set the output at 100 W, whereby a high frequency plasma atmosphere was formed at the inside postion of the coil.

On the other hand, while rotating the supports 704-1 and 704-2, the heating device 707 had been brought to the state under actuation and heated to about 475° C.

As the next step, the evaporating body 702 was irradiated and heated by the electron gun 708, thereby permitting silicon particles to fly. The electron gun had a power of about 0.5 KW.

Thus, a polycrystalline silicon thin film of 5000 Å was formed after 50 minutes.

With the use of this thin film a thin film transistor was prepared according to the same process as in the foregoing Examples. Table 10 set forth below shows the H content in the polycrystalline silicon layer, the etching rate of the film and effective mobility ($\mu$eff) of the thin film transistor in the present Example. At the same time, there are also shown the data in case of the partial hydrogen pressure of $4\times10^{-4}$ Torr and in case when the film was formed without introduction of hydrogen.

TABLE 10

| Partial hydrogen pressure $P_{H2}$ (Torr) | 0 | $5\times10^{-5}$ | $1\times10^{-4}$ | $4\times10^{-4}$ |
|---|---|---|---|---|
| Hydrogen content in film (atomic %) | <<0.01 | 0.8 | 1.5 | 1.8 |
| Etching rate of film (Å/sec) | 28 | 25 | 19 | 20 |
| $\mu$eff (cm$^2$/V.sec) | 0.05 | 0.10 | 2.4 | 2.1 |

In the transistor from the film formed at the partial hydrogen pressure of $P_{H2}=1\times10^{-4}$ Torr, there was no change in current (with lapse of time) after continuous application of the drain voltage $V_D$ and the gate voltage $V_G$ at 40 V, and the mobility was also as large as 2.4 cm$^2$/V.sec, thus exhibiting good transistor characteristics. In contrast, in the case when hydrogen content was larger, the change with lapse of time was greater, while the mobility was smaller at a lower hydrogen content.

EXAMPLE 18

Figure 4:
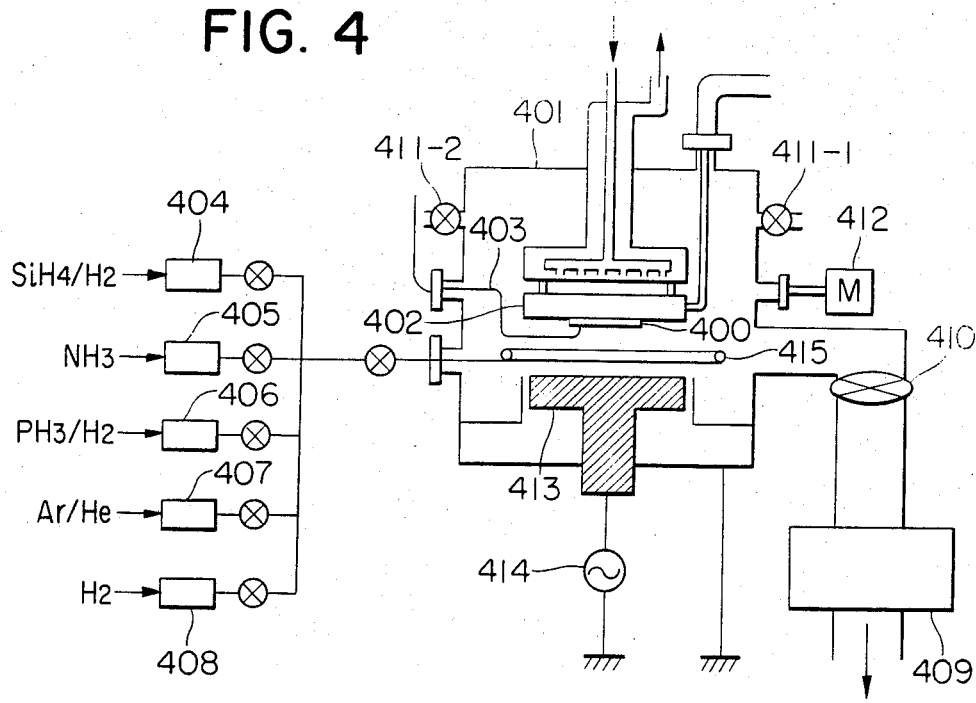
FIG. 4, FIG. 7 and FIG. 8 each shows a schematic sectional view for illustration of an example of a device for preparation of a semiconductor film of the present invention.

In this Example, a polycrystalline silicon thin film was formed on a substrate and TFT was prepared with the use of said thin film, and the device as shown in FIG. 4 was employed. As the substrate 400, there was employed a Corning glass #7059.

First, the substrate 400 was washed and lightly etched on its surface with a mixture of (HF+HNO$_3$+CH$_3$COOH) followed by drying and mounted on the substrate heating holder 402 on the upper anode side in a bell-jar deposition chamber 401.

The bell-jar 401 was thereafter evacuated by means of a diffusion pump 409 to a background vacuum degree of less than $2\times10^{-6}$ Torr. Then, the substrate 400 was maintained at 500° C. by elevation of Ts (the substrate temperature was monitored by the thermocouple 403). Next, H$_2$ gas was introduced into the bell-jar 401 under the control with the mass-flow controller 408 for cleaning of the surface of the substrate 400 to be ready for introduction of a reactive gas. The substrate temperature Ts was set at 450° C.

In this Example, as the reactive gas to be introduced, there was employed SiH$_4$ gas diluted to 1 vol.% with H₂ gas (abbreviated as "SiH₄ (1)/H₂") which was easy to handle. The flow rate of gas was controlled at 5 SCCM by use of a mass-flow controller 404. The inner pressure in the bell-jar 401 was controlled to 0.01 Torr by means of an absolute pressure gage 412 by controlling the pressure controlling valve 410 on the evacuation side of the bell-jar 401. After the inner pressure in the bell-jar 401 was stabilized, a high frequency field of 13.56 MHz was applied by the power source 414 on the cathode electrode 413 to commence glow discharge. The voltage was 0.5 V, the current 48 mA, and RF discharging power 10 W. The film formed had a thickness of 5000 Å, and when using a circular ring-type blowing outlet, its uniformity was within ±10% for the size of 120 mm×120 mm of the substrate.

The hydrogen content in the film formed was found to be 0.5 atomic %, and the surface unevenness characteristic was 200 Å. The etching rate with the aforesaid etchant was 15 Å/sec, which was the same as the etching rate of a silicon wafer having a value p=0.3 Ω.cm.

From the data of X-ray diffraction, the orientation characteristic of the above film was examined to find that it was 90% in terms of $[I(220)/I_{total}]\times 100$, with the average crystal particle size being 900 Å. Next, with the use of this film as the base material, a thin film transistor (TFT) was prepared according to the process as schematically illustrated in FIG. 3. As shown in the Step (a), after a polycrystalline silicon film 301 was deposited as described above on the glass substrate 300, PH₃ gas diluted to 100 vol. ppm with hydrogen gas (abbreviated as "PH₃ (100)/H₂")was permitted to flow into the bell-jar 401 at a molar ratio of PH₃ to SiH₄ of $5\times 10^{-3}$ (SiH₄ gas being diluted with H₂ to 10 vol.%, abbreviated as "SiH₄ (10)/H₂") to adjust the inner pressure in the bell-jar 401 at 0.12 Torr, whereupon a glow discharge was effected to form the n+ *layer 302 doped with P to a thickness of* 500 Å (Step (b)).

Then, as shown in the Step (c), the n=layer 302 was removed by photoetching except for the region for the source electrode 303 and the region for the drain electrod 304. Again, the above substrate was fixed on the heating holder 402 on the anode side in Similarly as in preparation of the polycrystalline silicon, the bell-jar 401 was evacuated, the substrate temperature Ts maintained at 250° C. and NH₃ gas was introduced at a flow rate of 20 SCCM and SiH₄(10)/H₂ gas at a flow rate of 5 SCCM, whereupon glow discharge was excited to deposit a SiNH film 305 to a thickness of 2500 Å.

Next, contact holes 306-2 and 306-1 for the source electrode 303 and the drain electrode 304 were opened by the photoetching step, and thereafter an electrode film 307 was formed on the entire surface of the SiNH film 305 by vapor deposition of Al, followed by working of the Al electrode film 307 by the photoetching step to form the lead-out electrode 308 for the source electrode, the lead-out electrode 309 for the drain electrode and the gate electrode 310. Thereafter, heat treatment was conducted at 250° C. in H₂ atmosphere. The TFT (channel length L=10μ, channel width W=500μ) formed according to the process under the conditions as described above was found to exhibit stable and good characteristics.

Figure 10:
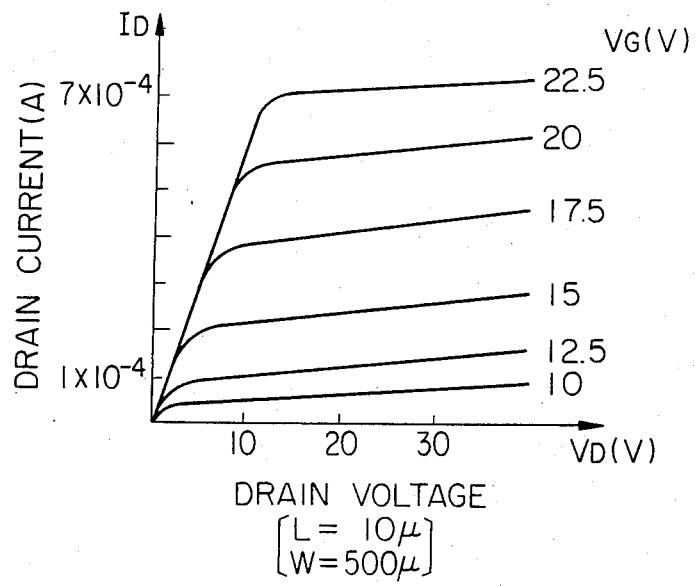

FIG. 10 shows the $V_D$-$I_D$ curve as one example of the characteristics of the thus prepared TFT (In FIG. 10, $V_D$ is drain voltage, $V_G$ gate voltage and $I_D$ drain current). At $V_G=20$ V, $I_D=2.5\times 10^{-4}$ A, $V_G=0$ V, $I_D=1\times 10^{-7}$ (A), and the threshold voltage (Vth) was 1.5 V. These values were determined from the straight line portion of the $$V_G - \sqrt{I_D}$$

curve as usually performed in MOS-TFT device. There was obtained a TFT having good transistor characteristics with an effective mobility (μeff) of 8.5 cm²/V.sec. For examination of stability of this TFT, DC current was continuously applied to the gate at $V_G=40$ V, and the change of $I_D$ was continuously measured over 500 hours. As the result, there was substantially no change in $I_D$, varying only within ±0.1%. And there was no change $\Delta V_{TH}$ in threshold before and after the change of TFT with lapse of time, thus indicating very good stability of TFT. When TFT characteristics, $V_D$-$I_D$, $V_G$-$I_D$ were measured after such a change with lapse of time, μeff was the same as before measurement of the change with lapse of time, namely 8.5 cm²/V.sec.

As shown in this Example, TFT of which main part is constituted of a polycrystalline silicon thin film having characteristics i.e. a hydrogen content in the polycrystalline silicon film of 0.5 atomic %, a maximum surface unevenness of 200 Å, an etching rate of 5 Å/sec, an orientation of 90% and an average crystal particle size of 900 Å has been evidenced to have a high performance.

EXAMPLE 19

According to the same procedure as in Example 18, there were prepared polycrystalline silicon films on BYCOLE glass substrates under the conditions of RF power (Po) of 50 W, SiH₄(1)/H₂ gas flow rate of 50 SCCM and glow discharge pressure (Pr) of 0.05 Torr. The substrate temperature (Ts) were set at intervals of 50° C. from 250° C. to 700° C., so as to prepare films with thicknesses of 0.5μ. The hydrogen contents in respective polycrystalline silicon films, surface unevenness characteristics, etching rates and effective mobilities (μeff) of TFT prepared similarly as in Example 18 from respective films are shown in Table 11.

As apparently seen from Table 11, those having hydrogen contents in excess of 3 atomic % or lower than 0.01 atomic % give an effective mobility of 1 cm²/V.sec. or lower, or samples with the maximum unevenness indicating the surface unevenness characteristic of 400 Å or more and an etching rate exceeding 20 Å/sec can give an effective mobility of 1 cm²/V.sec. or less, thus being practically inferior in both cases.

Further, the sample at Ts=700° C. has a small maximum surface unevenness of 250 Å with an etching rate of 15 Å/sec comparable to the etching rate of a silicon wafer, but due to the small hydrogen content of less than 0.01 atomic %, it can give only a small effective mobility (μeff) of 0.25 cm²/V.sec to be also practically inferior.

TABLE 11

| | Sample No. | | | | | | | | | |
|---|---|---|---|---|---|---|---|---|---|---|
| | 19-1 | 19-2 | 19-3 | 19-4 | 19-5 | 19-6 | 19-7 | 19-8 | 19-9 | 19-10 |
| Ts (°C.) | 250 | 300 | 350 | 400 | 450 | 500 | 550 | 600 | 650 | 700 |
| Hydrogen content | | | | | | | | | | |

TABLE 11-continued

| | Sample No. | | | | | | | | | |
|---|---|---|---|---|---|---|---|---|---|---|
| | 19-1 | 19-2 | 19-3 | 19-4 | 19-5 | 19-6 | 19-7 | 19-8 | 19-9 | 19-10 |
| (atomic %) | 4.8 | 4.2 | 3.6 | 3.2 | 2.5 | 1.2 | 0.5 | 0.1 | 0.02 | <0.01 |
| Surface unevenness (Å) | 600 | 500 | 400 | 350 | 250 | 200 | 250 | 200 | 200 | 200 |
| Etching rate (Å/sec) | 38 | 30 | 22 | 18 | 15 | 15 | 15 | 15 | 15 | 15 |
| $\mu$eff (cm$^2$/V.sec) | 0.23 | 0.35 | 0.50 | 1.3 | 5.5 | 7.5 | 4.0 | 2.8 | 1.8 | 0.25 |
| $I_D$ change with lapse of time (%) | 5.9 | 2.8 | 1.5 | 0.5 | <0.1 | <0.1 | <0.1 | <0.1 | <0.1 | 1.5 |
| Orientation (%) | 29 | 55 | 70 | 85 | 88 | 90 | 93 | 90 | 92 | 90 |
| Average crystal particle size (Å) | 150 | 200 | 300 | 400 | 500 | 550 | 600 | 700 | 700 | 800 |
| $\Delta V_{TH}$ (V) | 1.0 | 0.6 | 0.3 | 0 | 0 | 0 | 0 | 0 | 0 | 0 |

In the above samples, there are shown the cases where films employed have greater surface unevenness as the hydrogen contents in the polycrystalline silicon thin films increase. For the purpose of comparison with the present invention, the following experiments were carried out in which the hydrogen content were 3 atomic % or less, but the surface unevenness was great or the etching rate was great, to obtain the results that both cases were also practically inferior.

According to the same procedure as in Example 18, there were prepared on Corning #7059 glass substrates a film (Sample A) under the conditions of Ts=450° C., SiH$_4$(1)/H$_2$ gas flow rate of 50 SCCM, Po=100 W and Pr=0.2 Torr to a thickness of 0.5$\mu$, and a film (Sample B) under the conditions of Ts=450° C., SiH$_4$(1)/H$_2$ gas flow rate of 50 SCCM, Po=300 W and Pr=0.05 Torr. For each of these films, hydrogen content, surface unevenness and etching rate were determined. Also, TFT's were prepared with the use of the films of Samples A and B by the same method as in Example 18, and effective mobilities ($\mu$eff) thereof were determined. The results are shown in Table 12.

Sample A had a hydrogen content less than 3 atomic % with a relatively small etching rate, but a large maximum surface unevenness of 900 Å, while Sample B had a hydrogen content less than 3 atomic % and a small maximum surface unevenness of 250 Å, but its etching rate was as large as 32 Å/sec.

TFT prepared by using each of Examples A and B had an effective mobility ($\mu$eff) which proved to be extremely smaller as compared with the samples shown in Example 18, and was also relatively inferior in stability of the characteristics.

TABLE 12

| Sample | A | B |
|---|---|---|
| Hydrogen content (atomic %) | 2.8 | 2.2 |
| Surface unevenness (Å) | 900 | 250 |
| Etching rate (Å/sec) | 19 | 32 |
| $\mu$eff (cm$^2$/V.sec) | 0.32 | 0.35 |
| Change with lapse of time (%) | 1.8 | 2.5 |
| $\Delta V_{TH}$ (V) | 0.4 | 0.5 |

Further, for comparative purpose, measurements were conducted for the samples prepared as follows.

According to the same procedure as in Example 18, a polycrystalline silicon thin film was prepared on a Corning #7059 glass under the conditions of Ts=450° C., Po−50W, Pr=0.05 Torr and SiH$_4$(1)/H$_2$ gas flow rate of 500 SCCM to a thickness of 0.5$\mu$. This film had a hydrogen content of 2.7 atomic %, a maximum surface unevenness of 300 Å, an etching rate of 18 Å/sec, an orientation of 30% and an average crystal particle size of 300 Å.

TFT was also prepared according to the same method as in Example 18 and its effective mobility ($\mu$eff) was determined to be 0.35 cm$^2$/V.sec. As for the change with lapse of time of TFT, the change of $I_D$ with lapse of time was 2.4 % and $\Delta V_{TH}$ was 0.5 V, thus indicating poor stability.

EXMPLE 20

A Corning #7059 glass substrate 800 prepared similarly as in Example 18 was mounted on a substrate holder 802 in the ultra-high vacuum tank 801 which can be reduced to a pressure of 2×10$^{-11}$ Torr as shown in FIG. 8, and after reduction of the pressure in the vacuum tank 801 to a pressure of less than 5×10$^{-11}$ Torr, the substrate temperature was set at 400° C. by the tantalum heater 803. Subsequently, the electron gun 804 was actuated under an acceleration voltage of 8 KV, and the electron beam emitted irradiated the silicon evaporating body 805 to evaporate the silicon evaporating body 805, followed by opening of the shutter 807 to form a polycrystalline silicon film on the substrate 800, while controlling the film thickness by means of the quartz oscillator thickness meter 806 to 0.5$\mu$ thickness. The pressure during the vapor deposition was 1×10$^{-9}$ Torr and the vapor deposition rate was 1.4 Å/sec. (Sample 20-1)

On the other hand, a washed Corning #7059 glass substrate was again fixed onto the substrate holder 802, and after evacuation of the inner pressure in the vacuum tank 801 to less than 5×10$^{-11}$, a high purity hydrogen gas (99.99999%)was introduced into the vacuum tank 801 through the variable leak valve 808 to set the inner pressure in the tank 801 at 5×10$^{-7}$ Torr. The substrate temperature was set at 400° C., and the film-forming rate was controlled to be 1.4 Å/sec, whereby a polycrystalline silicon film of a thickness of 0.5$\mu$ was formed (Sample No. 20-2).

For Samples No. 20-1 and No. 20-2, hydrogen contents, etching rates, surface unevenness characteristics, orientation characteristics and crystal particle size were measured by using a part of each film, and the remainder was used for preparing TFT and the effective mobility was measured. The results are shown in Table 13.

TABLE 13

| Sample No. | 20-1 | 20-2 |
|---|---|---|
| Hydrogen content (atomic %) | <0.01 | 0.2 |
| Surface unevenness (Å) | 250 | 25 |
| Etching rate (Å/sec) | 15 | 15 |
| Orientation characteristic (%) | 92 | 90 |
| Crystal particle size (Å) | 900 | 900 |
| $\mu_{eff}$ (cm$^2$/V.sec) | 0.25 | 3.2 |
| Change of $I_D$ with lapse of time (%) | 2.5 | <0.1 |
| $\Delta V_{TH}$ (V) | 0.5 | 0 |

As can be seen from Table 13, Samples No. 20-1 and 20-2 both exhibited substantially the same values of surface unevenness characteristics, etching rate, crystal particle size and orientation characteristic, but the hydrogen content was as small as less than 0.01 atomic % in Sample 20-1 while it was 0.2 atomic % in Sample 20-2. For this reason, effective mobility ($\mu$eff) of Sample No. 20-2 was greater by one place than Sample No.20-1, and Sample 20-2 was also better in stability of TFT, thus indicating superiority of Sample No. 20-2 as semiconductor layer of TFT.

EXAMPLE 21

An example is to be described below in which a polycrystalline silicon thin film semiconductor layer is prepared by the ion-plating deposition device as shown in FIG. 7 and a thin film transistor is prepared from said thin film.

First, in a deposition chamber 701 which can be brought to reduced pressure, there was placed a non-doped polycrystalline silicon body to be evaporated 702 in a boat 703 and a Corning #7059 substrate was set on the supports 704-1 and 704-2. After the deposition chamber was evacuated to a base pressure of about $1 \times 10^{-7}$ Torr, H$_2$ gas with a purity of 99.999% was introduced through the gas inlet tube 705 into the deposition chamber to a hydrogen partial pressure $P_{H2}$ of $1 \times 10^{-4}$ Torr. The gas inlet tube employed had an inner diameter of 2 mm and shaped at its tip in a loop having gas blowing openings of 0.5 mm in diameter at intervals of 2 cm.

Then, high frequency power of 13.56 MHz was applied on the high frequency coil 706 (5 mm in diameter) to set the output at 100 W, whereby a high frequency plasma atmosphere was formed at the inside portion of the coil.

On the other hand, while rotating the supports 704-1 and 704-2, the heating device 707 had been brought to the state under actuation and heated to about 450° C.

As the next step, the evaporating body 702 was irradiated and heated by the electron gun 708, thereby permitting the heated silicon particles to fly. The electron gun had a power of about 0.5 KW.

Thus, a polycrystalline silicon thin film of 5000 Å was formed after 50 minutes.

With the use of this thin film, a thin film transistor was prepared according to the same process as in the foregoing Examples. Table 14 set forth below shows the H content in the polycrystalline silicon layer, the unevenness characteristic, the etching rate of the film prepared in this Example and effective mobility ($\mu$eff) of the thin film transistor prepared. At the same time, there are also shown the data in case of the partial hydrogen pressure $P_{H2}$ of $4 \times 10^{-4}$ Torr and in case when the film was formed without introduction of hydrogen.

TABLE 14

| Sample No. | 21-1 | 21-2 | 21-3 | 21-4 |
|---|---|---|---|---|
| Partial hydrogen pressure $P_{H2}$ (Torr) | 0 | $7 \times 10^{-5}$ | $2 \times 10^{-4}$ | $5 \times 10^{-4}$ |
| Hydrogen content (atomic %) | 0 | 1.0 | 2.1 | 5.2 |
| Etching rate (Å/sec) | 28 | 24 | 18 | 19 |
| Surface unevenness (Å) | 500 | 400 | 500 | 600 |
| $\mu$eff (cm$^2$/V.sec) | 0.05 | 0.10 | 2.4 | 2.1 |

In the transistor from the film (Sample 21-3) formed at the partial hydrogen pressure of $P_{H2} = 2 \times 10^{-4}$ Torr, there was no change in $I_D$ with lapse of time after continuous application of the drain voltage $V_D$ and the gate voltage $V_G$ at 40 V, and the mobility ($\mu$eff) was also as large as 2.4, thus exhibiting good transistor characteristics. In contrast, in the case when hydrogen content was larger, the change with lapse of time was greater, while the mobility was smaller at lower hydrogen content.

EXAMPLE 22

A similar Corning glass #7059 substrate 400 prepared in the same manner as described in Example 18 was fixed in close contact on the substrate heating holder 402 on the upper anode side in the bell-jar 401, and a polycrystalline silicon plate (not shown: 99.99%) was placed on the electrode plate of the lower cathode 413 so as to confront the substrate. The bell-jar 401 was evacuated by the diffusion pump 409 to $2 \times 10^{-6}$ Torr and the substrate heating holder 402 was heated to maintain the surface temperature of the substrate 400 at 350° C.

Subsequently, a high purity H$_2$ gas was introduced into the bell-jar at 0.5 SCCM through the mass-flow meter 408, further Ar gas was introduced into the bell-jar 401 at a flow rate of 10 SCCM through the mass-flow meter 407, followed by closing of the main valve 410 to set the inner pressure in the bell-jar at 0.005 Torr.

After the inner bell-jar pressure was stabilized, a voltage of 2.0 KV was applied to the lower cathode electrode 413 by the high frequency source 414 of 13.56 MHz to excite glow discharge between the polycrystalline silicon plate on the cathode 413 and the anode (substrate heating holder) 402 under discharging power of 200 W.

The growth rate of the film under these conditions was 0.3 Å/sec, whereby about 0.5$\mu$ thick film was formed after 7 hours of growth.

The hydrogen content in the thus formed polycrystalline silicon film was found to be 1.2 atomic %, and the unevenness on the silicon film surface was at its maximum about 300Å, with the etching rate being 18 Å/sec.

Subsequently, with utilization of a part of the above film, following the same steps as in Example 18, TFT was prepared. The element had an effective mobility ($\mu$eff) of 1.2 (cm$^2$/V.sec). When the changes of $I_D$ and Vth were measured under the conditions of $V_G = V_D = 40$ V, $I_D$ was changed by 0.2% and Vth entirely unchanged after 500 hours, thus indicating good stability.

For the purpose of comparison with the above sample, the following sample was prepared and measured similarly.

A similar Corning glass #7059 substrate 400 prepared in the same manner as described in Example 18 was fixed in close contact on the substrate heating holder 402 on the upper anode side in the bell-jar 401, and a polycrystalline silicon plate (not shown: 99.99%) was placed on the electrode plate of the lower cathode 413 so as to confront the substrate. The bell-jar 401 was evacuated by the diffusion pump 409 to $2\times10^{-6}$ and the substrate heating holder 402 was heated to maintain the surface temperature of the substrate 400 at 350° C. Subsequently, a high purity $H_2$ gas was introduced into the bell-jar 401 at 2 SCCM through the mass-flow meter 408, further Ar gas was introduced into the bell-jar 401 at a flow rate of 10 SCCM through the mass-flow meter 407, followed by controlling the main valve 410 to set the inner pressure in the bell-jar at 0.05 Torr.

After the inner bell-jar pressure was stabilized, a voltage of 2.6 KV was applied to the lower cathode electrode 413 by the high frequency source 414 of 13.56 MHz to excite glow discharge between the polycrystalline silicon plate on the cathode 413 and the anode (substrate heating holder) 402. The RF discharging power travelling wave power - reflection wave power) during this operation was 300 W. The growth rate of the silicon film under these conditions was 0.5 Å/sec, whereby about $0.54\mu$ thick film was formed after 3 hours of growth.

The hydrogen content in the thus formed polycrystalline silicon film was found to be 8.5 atomic %, and the unevenness on the silicon film surface was at its maximum about 500 Å, with the etching rate being 35 Å/sec.

Subsequently, following the same steps (a)–(g) as in Example 18, TFT was prepared. The element had an effective mobility ($\mu$eff) of 0.2 (cm$^2$/V.sec). When the changes of $I_D$ and Vth were measured under the conditions of $V_G=40$ V and $V_d=40$ V, $I_D$ was reduced by 12% and $\Delta$Vth was 3 V after 500 hours, thus exhibiting very poor stability of TFT.

We claim:

1. A semiconductor device which comprises a substrate and a semiconductor layer of a polycrystalline silicon thin film formed on the substrate, said film containing hydrogen atoms in an amount of not more than 3 atomic % and having a surface unevenness of substantially not more than 800 Å at its maximum, and said semiconductor layer of a polycrystalline silicon thin film constituting the main part of the semiconductor device.

2. A semiconductor device which comprises a semiconductor layer of a polycrystalline silicon thin film containing hydrogen atoms in an amount of not more than 3 atomic % and having an etching rate of 20 Å/sec or less by etching with an etchant comprising a mixture of hydrofluoric acid (50 vol. % aqueous solution), nitric acid ( d =1.38, 60 vol. % aqueous solution) and glacial acetic acid at a mixing ratio by volume of 1:3:6, and said semiconductor layer of a polycrystalline silicon thin film constituting the main part of the semiconductor device.

3. A semiconductor device which comprises a semiconductor layer of a polycrystalline silicon thin film containing hydrogen atoms in an amount of not more than 3 atomic % having a surface unevenness of substantially not more than 800 Å at its maximum and having an etching rate of 20 Å/sec. or less by ethhing with an etchant comprising a mixture of hydrofluoric acid (50 vol. % aqueous solution), nitric acid (d =1.38, 60 vol. % aqueous solution) and glacial acetic acid at a mixing ratio by volume of 1 : 3 : 6 and said semiconductor layer of a polycrystalline silicon thin film constituting the main part of the semiconductor device.

4. A semiconductor device according to claim 1, wherein said semiconductor layer has an X-ray diffraction pattern or an electron beam diffraction pattern, of which the orientation strength at the (220) plane is 30 % or more based on the total orientation strength.

5. A semiconductor device according to claim 2, wherein said semiconductor layer has an X-ray diffraction pattern or an electron beam diffraction pattern, of which the orientation strength at the (220) plane is 30 % or more based on the total orientation strength.

6. A semiconductor device according to claim 3, wherein said semiconductor layer has an X-ray diffraction pattern or an electron beam diffraction pattern, of which the orientation strength at the (220) plane is 30 % or more based on the total orientation strength.

7. A semiconductor device according to claim 1, wherein said semiconductor layer contains crystals with an average particle size of 200 Å or larger.

8. A semiconductor device according to claim 2, wherein said semiconductor layer contains crystals with an average particle size of 200 Å or larger.

9. A semiconductor device according to claim 3, wherein said semiconductor layer contains crystals with an average particle size of 200 Å or larger.

10. A semiconductor device according to claim 1, wherein said substrate is a glass.

* * * * *

UNITED STATES PATENT AND TRADEMARK OFFICE
CERTIFICATE OF CORRECTION

PATENT NO. : 4,905,072
DATED : February 27, 1990
INVENTOR(S) : TOSHIYUKI KOMATSU, ET AL.

It is certified that error appears in the above-identified patent and that said Letters Patent is hereby corrected as shown below:

COLUMN 16

Line 28, "13 56 MHz" should read --13.56 MHz--.

COLUMN 18

Line 25, "$n^=$" should read --$n^+$--.

COLUMN 23

Line 38, "$n^=$layer" should read --$n^+$ layer--.
Line 42, "in Similarly" should read --in the bell-jar 401 so as to form a gate insulating film. Similarly,--.

UNITED STATES PATENT AND TRADEMARK OFFICE
CERTIFICATE OF CORRECTION

PATENT NO. : 4,905,072
DATED : February 27, 1990
INVENTOR(S) : TOSHIYUKI KOMATSU, ET AL.

It is certified that error appears in the above-identified patent and that said Letters Patent is hereby corrected as shown below:

COLUMN 29

Line 11, "$2 \times 10^{-6}$" should read --$2 \times 10^{-6}$ Torr--.
    Line 27, "power travelling" should read --power (travelling--.

Signed and Sealed this

Twenty-second Day of October, 1991

*Attest:*

HARRY F. MANBECK, JR.

*Attesting Officer*      *Commissioner of Patents and Trademarks*